US010551432B2

(12) United States Patent
Ishii et al.

(10) Patent No.: US 10,551,432 B2
(45) Date of Patent: Feb. 4, 2020

(54) METHOD OF MANUFACTURING SEMICONDUCTOR DEVICE

(71) Applicant: Renesas Electronics Corporation, Tokyo (JP)

(72) Inventors: Toshitsugu Ishii, Gunma (JP); Naohiro Makihira, Gunma (JP); Hidekazu Iwasaki, Gunma (JP); Jun Matsuhashi, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 105 days.

(21) Appl. No.: 15/954,657

(22) Filed: Apr. 17, 2018

(65) Prior Publication Data

US 2018/0340976 A1 Nov. 29, 2018

(30) Foreign Application Priority Data

May 24, 2017 (JP) .................................. 2017-102552

(51) Int. Cl.
*G01R 31/28* (2006.01)
*H01L 21/48* (2006.01)
*G01R 1/04* (2006.01)
*H01L 21/66* (2006.01)
*G01R 1/067* (2006.01)
*H01L 21/56* (2006.01)

(52) U.S. Cl.
CPC ....... *G01R 31/2887* (2013.01); *G01R 1/0466* (2013.01); *G01R 1/0483* (2013.01); *G01R 1/06722* (2013.01); *G01R 31/2896* (2013.01); *H01L 21/4825* (2013.01); *H01L 21/4842* (2013.01); *H01L 21/4853* (2013.01); *H01L 21/565* (2013.01); *H01L 22/14* (2013.01)

(58) Field of Classification Search
CPC .............. G01R 31/2887; G01R 1/0483; G01R 1/06722; G01R 1/0466; G01R 31/2896; G01R 1/06761; G01R 1/067; H01L 21/4853; H01L 21/4825; H01L 21/4842; H01L 22/14; H01L 21/565; H01L 2224/05554; H01L 2224/32225; H01L 2224/32245; H01L 2224/48091; H01L 2224/48227; H01L 2224/48247; H01L 2224/49171; H01L 2224/73265; H01L 2924/15311; H01L 23/49582; H01L 23/49503
USPC ....................................... 324/755.05; 438/614
See application file for complete search history.

(56) References Cited

U.S. PATENT DOCUMENTS 6,514,847 B1 * 2/2003 Ohsawa .................. H01L 23/24
438/614

FOREIGN PATENT DOCUMENTS

| JP | 2008-249449 A | 10/2008 |
| JP | 2011-202970 A | 10/2011 |
| JP | 2014-81231 A | 5/2014 |

* cited by examiner

*Primary Examiner* — Farhana A Hoque
(74) *Attorney, Agent, or Firm* — Mattingly & Malur, PC

(57) ABSTRACT

A semiconductor device is manufactured at an improved efficiency. The method of the invention includes a step of carrying out an electrical test by bringing an external terminal electrically coupled to a semiconductor chip mounted on a semiconductor device into contact with a tip portion of a probe pin coupled to a test circuit and thereby electrically coupling the semiconductor chip to the test circuit. The probe pin has a tip portion comprised of a base material, a nickel film formed thereon, and a conductive film formed thereon and made of silver. The conductive film is thicker than the nickel film.

15 Claims, 20 Drawing Sheets

| RESISTANCE (mΩ/Pin) | 0 TIME (WITHOUT CONTACT) | 300 THOUSAND TIMES |
|---|---|---|
| PA102(PAca) | 24 | 136 |
| PA1(PAca) | 27 | 69 |
| PA2(PAca) | 23 | 58 |
| PA102(PAcb) | 26 | 106 |
| PA1(PAcb) | 29 | 69 |
| PA2(PAcb) | 30 | 64 |

| RESISTANCE (mΩ/Pin) | 0 TIME (WITHOUT CONTACT) | 300 THOUSAND TIMES |
|---|---|---|
| PA102(PAca) | 43 | 258 |
| PA1(PAca) | 40 | 101 |
| PA2(PAca) | 34 | 85 |
| PA102(PAcb) | 39 | 183 |
| PA1(PAcb) | 38 | 86 |
| PA2(PAcb) | 43 | 84 |

METHOD OF MANUFACTURING SEMICONDUCTOR DEVICE

CROSS-REFERENCE TO RELATED APPLICATIONS

The disclosure of Japanese Patent Application No. 2017-102552 filed on May 24, 2017 including the specification, drawings, and abstract is incorporated herein by reference in its entirety.

BACKGROUND

The present invention relates to a technique of manufacturing a semiconductor device, in particular, to a technique effective when applied to a step of pressing a test terminal against an external terminal of a semiconductor device to make an electrical test.

Japanese Unexamined Patent Application Publication No. 2011-202970 (Patent Document 1) describes a probe needle having, at the tip portion thereof, a plurality of granular protrusions made of a plated film and used for a continuity test of an electronic circuit.

Japanese Unexamined Patent Application Publication No. 2008-249449 (Patent Document 2) describes a probe needle obtained by fixing hard particles such as diamond to the tip of a base material made of tungsten by metal plating.

Japanese Unexamined Patent Application Publication No. 2014-81231 (Patent Document 3) describes a probe pin having, at the tip portion thereof, a periodically rugged surface. Patent Document 1: Japanese Unexamined Patent Application Publication No. 2011-202970
Patent Document 2: Japanese Unexamined Patent Application Publication No. 2008-249449
Patent Document 3: Japanese Unexamined Patent Application Publication No. 2014-81231

SUMMARY

The present inventors have investigated contact stability and prolongation of the life of a test terminal in a method of manufacturing a semiconductor device including a step of carrying out an electrical test.

In the method of manufacturing a semiconductor device, there is a demand for improvement in the manufacturing efficiency of the semiconductor device.

Another problem and novel features will be apparent from the description herein and accompanying drawings.

A method of manufacturing a semiconductor device according to one embodiment includes a step of bringing an external terminal electrically coupled to a semiconductor chip included in a semiconductor device into contact with a contact region of a test terminal coupled to a test circuit and thereby electrically coupling the semiconductor chip and the test circuit and performing an electrical test. The contact region of the test terminal is comprised of a base material, a nickel film formed on the base material, and a conductive film formed on the nickel film and made of silver. The conductive film is thicker than the nickel film.

The one embodiment makes it possible to improve the manufacturing efficiency of a semiconductor device.

Figure 1:
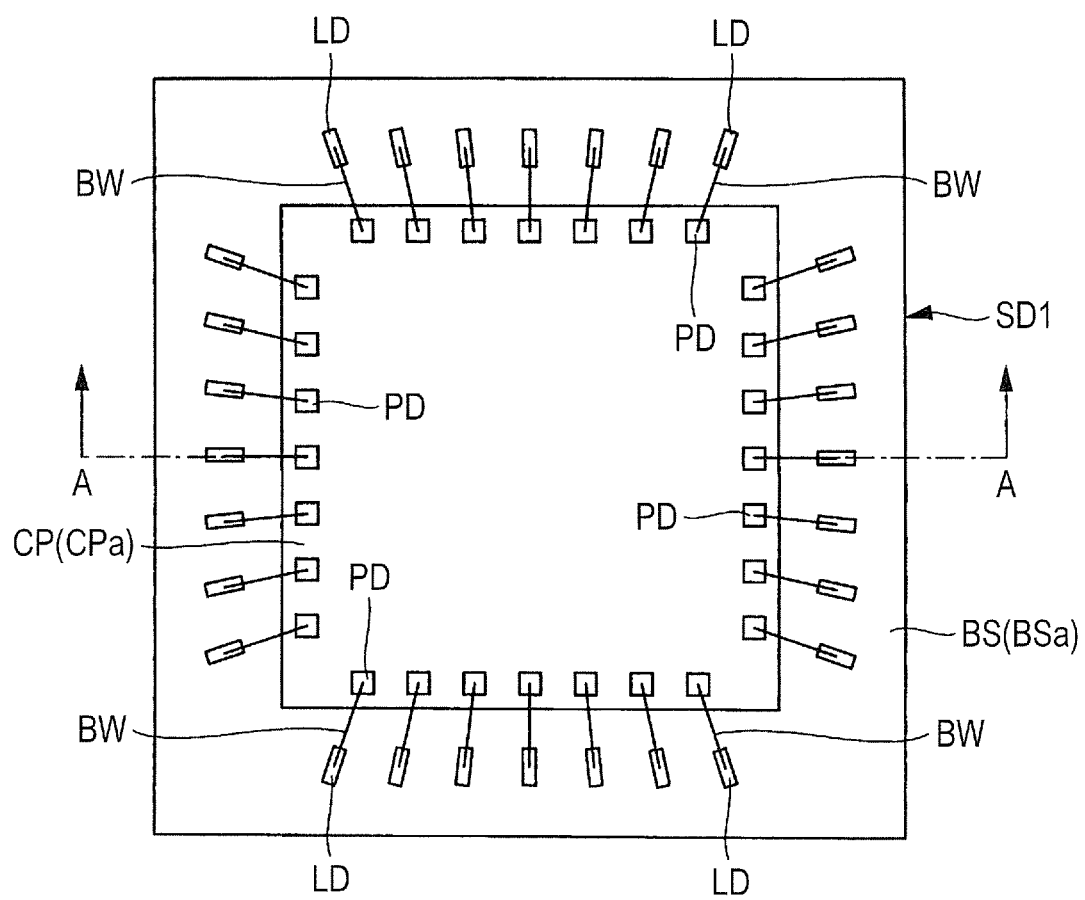
FIG. 1 is a see-through plan view showing the outline of the internal structure of a semiconductor device of the present embodiment.

DETAILED DESCRIPTION (Description form, basic terms, and usage in the present application)

In the application, a description in an embodiment may be made after divided in a plurality of sections if necessary for the sake of convenience. These sections are not independent from each other, but they may each be a part of a single example or one of them may be a partial detail of the other or a modification example of a part or whole of the other one unless otherwise particularly specified. In principle, a description of a portion similar to that described before is not repeated. Moreover, when a reference is made to constituent components in the embodiment, they are not essential unless otherwise particularly specified, limited to the number theoretically, or apparent from the context.

Similarly, in the description of the embodiment and the like, the term "X made of A" or the like with regard to a material, composition, or the like does not exclude a member containing a component other than A unless otherwise particularly specified or unless otherwise evident from the context. For example, with regard to a component, the above term means "X containing A as a principal component" or the like. It is needless to say that for example, the term "silicon member" or the like is not limited to pure silicon but it may include a multicomponent alloy having silicon as a principal component such as SiGe alloy and a member containing an additive in addition. Similarly, the term "gold plating", "Cu layer", "nickel plating", or the like includes not only a pure member but also a member containing gold, Cu, nickel, or the like as a principal component, respectively, unless otherwise particularly specified.

When a reference is made to a specific numerical value or amount, it may be more than or less than the specific numerical value or amount unless otherwise particularly specified, limited to the specific numerical value or amount theoretically, or apparent from the context.

In all the drawings in the embodiment, the same or like members will be identified by the same or like symbols or reference numerals and overlapping descriptions will be omitted in principle.

In the accompanying drawings, hatching or the like is sometimes omitted even from the cross-section when it makes the drawing complicated or when a member can be distinguished clearly from a vacant space. In relation thereto, even a planarly closed hole may be shown without a background contour thereof when it is obvious from the description or the like that the hole is planarly closed. On the other hand, in order to clearly show that a region is not a vacant space, hatching may be added even when the drawing is not a cross-sectional view.

Embodiment

<Semiconductor Device>

Figure 2:
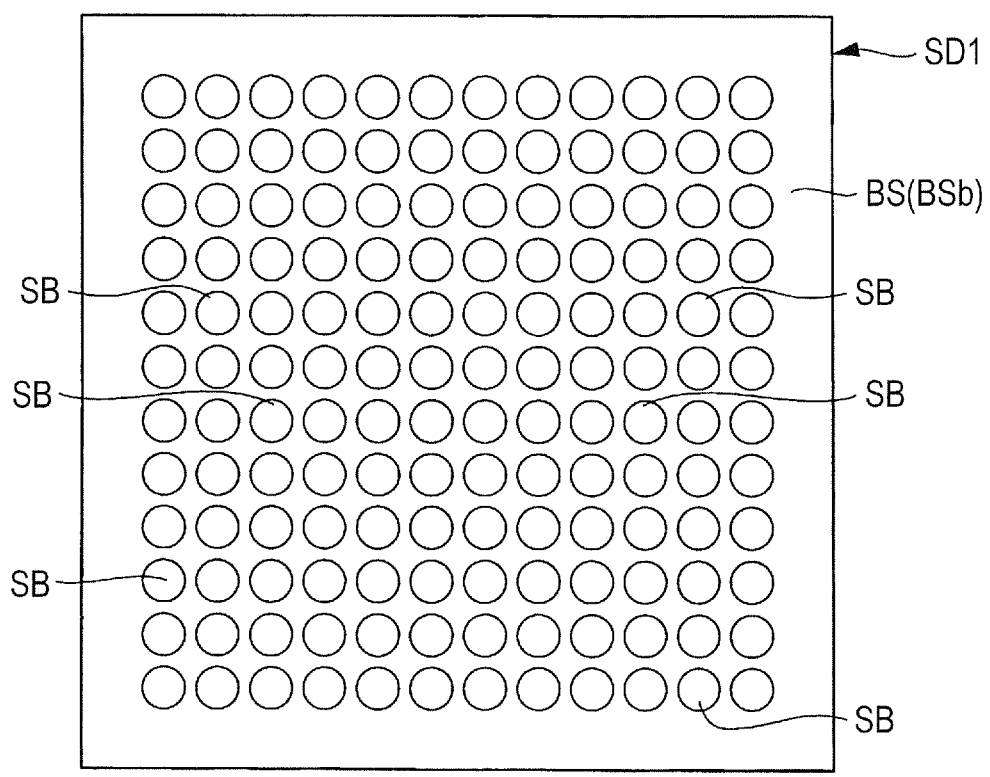
FIG. 2 is a plan view showing the back surface side of the semiconductor device shown in FIG. 1.
Figure 3:
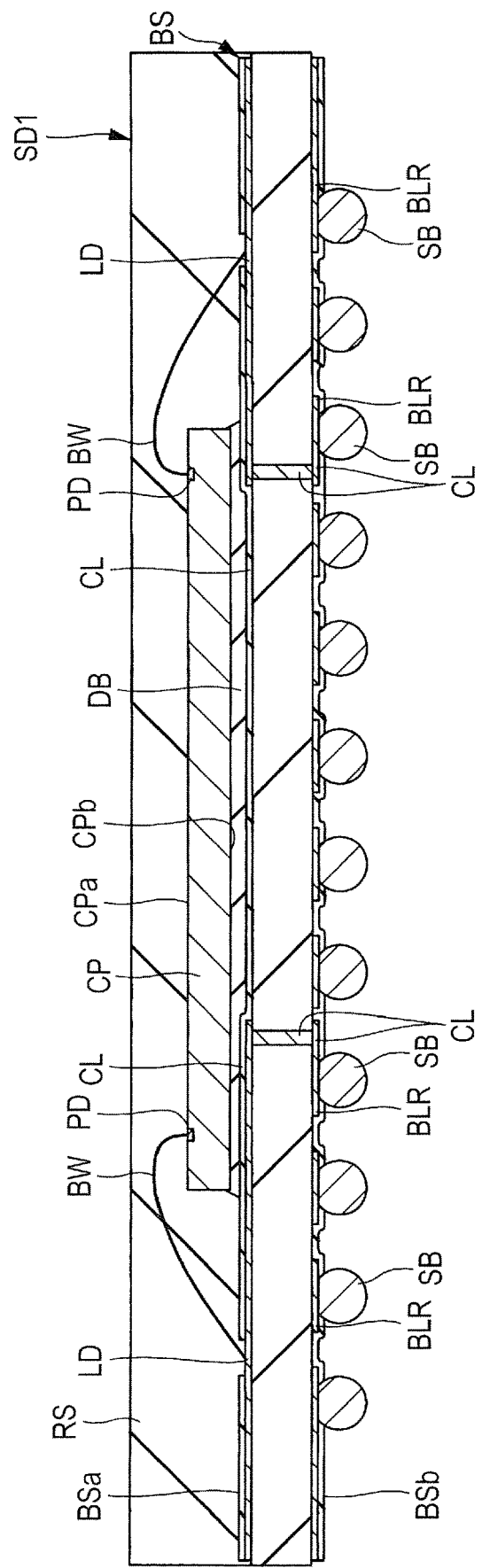
FIG. 3 is a cross-sectional view taken along the line A-A of FIG. 1.

FIG. 1 is a see-through plan view showing the outline of the internal structure of a semiconductor device, FIG. 2 is a plan view showing the back surface side of the semiconductor device shown in FIG. 1, and FIG. 3 is a cross-sectional view taken along the line A-A of FIG. 1. In FIG. 1, a sealed body RS is shown in a see-through state in order to show the planar arrangement inside a semiconductor device SD1.

The semiconductor device SD1 has a semiconductor chip CP to be mounted on a surface BSa of a wiring board BS, a plurality of wires (conductive members) BW that electrically couples the semiconductor chip CP to the wiring board BS, a sealed body RS that seals the semiconductor chip CP and the plurality of wires BW, and a plurality of solder balls SB formed on the side of a back surface BSb of the wiring board BS and electrically coupled to the semiconductor chip CP.

The solder balls SB are external terminals for electrically coupling the semiconductor device SD1 to a mounting board (not shown) on which the semiconductor device SC1 is mounted. The solder ball SB is made of a so-called lead-free solder, that is, a solder not substantially containing lead (Pb). It is made of, for example, only tin (Sn), tin-bismuth (Sn—Bi), tin-copper (Sn—Cu), or tin-copper-silver (Sn—Cu—Ag). The term "lead-free solder" means a solder having a lead (Pb) content of 0.1 wt % or less and this content is specified as the standard instructed by RoHs (Restriction of Hazardous Substances).

In the examples shown in FIGS. 1 to 3, the semiconductor chip CP is mounted on the wiring board BS which is a base material by a so-called face up mounting system in which the semiconductor chip CP is mounted while facing a back surface CPb to the surface BSa of the wiring board BS. More specifically, a plurality of pad electrodes PD formed on a surface CPa of the semiconductor chip CP is electrically coupled via a plurality of wires BW to a lead LD placed around the semiconductor chip CP in plan view so as to expose from the side of the surface BSa of the wiring board BS.

The sealing body RS has a substantially rectangular planar shape having four sides and the sealing body RS has, at the center portion thereof, the semiconductor chip CP. The sealing body RS seals the semiconductor chip CP and the plurality of wires BW on the surface BSa of the wiring board BS and prevents deformation of the wires BW.

The wiring board BS has, on the back surface BSb positioned on the side opposite to the surface BSa, a plurality of solder balls SB. The solder balls SB are electrically coupled to the lead LD formed on the side of the surface BSa of the wiring board BS via a wiring CL formed on the wiring board BS. In short, the plurality of pad electrodes PDs of the semiconductor chip CP is electrically coupled to the plurality of solder balls SB. When the semiconductor device SD1 is mounted on a mounting board not shown, the solder balls SB are bonded to terminals (illustration is omitted) of the mounting board for electrical coupling. This means that the solder balls SB serve as external terminals (external electrodes) of the semiconductor device SD1.

As shown in FIG. 2, the solder balls SB are arranged in matrix form on the side of the back surface BSb of the wiring board BS. This means that the semiconductor device SD1 is an area-array type semiconductor device in which solder balls SB are arranged in matrix form on the side of the back surface (mounting surface) BSb of the wiring board BS. This area-array type semiconductor device makes use of the side of the back surface BSb of the wiring board BS effectively as an arrangement space of external terminals. The area-array type semiconductor device is therefore advantageous because it can have an increased number of external terminals compared with a semiconductor device using a lead-frame as a base material on which a semiconductor device is mounted such as QFP (Quad Flat Package) or QFN (Quad Flat Non-leaded Package).

Examples of the area-array type semiconductor device include, in addition to a BGA (ball grid array) type semiconductor device equipped with solder balls SB as an external terminal, an LGA (land grid array) type semiconductor device from which a land (external terminal) BLR for attaching a bonding member such as solder is exposed.

<Manufacturing Steps of Semiconductor Device>

Figure 4:
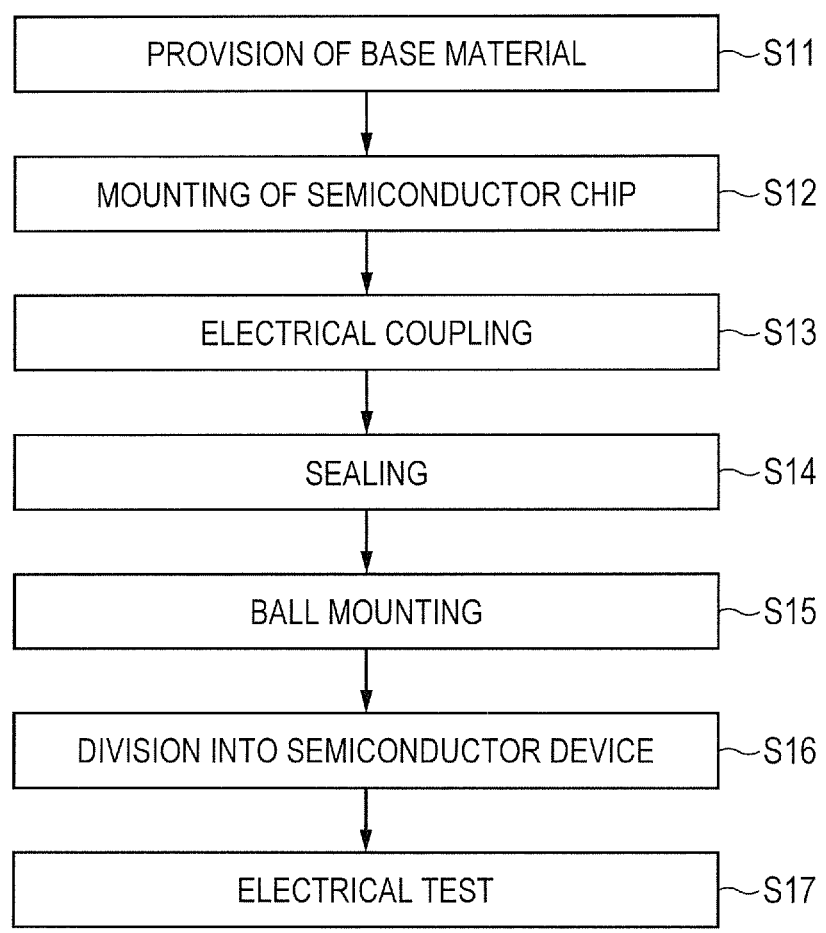
FIG. 4 is a process flow chart showing the manufacturing steps of the semiconductor device shown in FIGS. 1 to 3.

Next, manufacturing steps of the semiconductor device SD1 shown in FIGS. 1 to 3 will be described. FIG. 4 is an explanatory chart showing the fabrication flow of the semiconductor device shown in FIGS. 1 to 3.

1. Base Material Providing Step (S11)

In the base material providing step (S11) shown in FIG. 4, a wiring board (base material) is provided. Although not shown, a product formation region of this wiring board (base material) corresponds to one of the wiring boards BS shown in FIG. 1 and this product formation region has, therearound, a cut region along which the wiring board (base material) is cut in the division step (S16) shown in FIG. 4.

2. Semiconductor Chip Mounting Step (S12)

Next, in the semiconductor chip mounting step (S12) shown in FIG. 4, the semiconductor chip CP is mounted on the wiring board BS shown in FIG. 1 via an adhesive DB. As the adhesive DB, for example, a thermosetting resin or a mixture of the thermosetting resin with silver (Ag) particles is used. The semiconductor chip is mounted, for example, by a so-called face-up mounting system in which the semiconductor chip CP is mounted on the surface BSa of the wiring board BS while facing the back surface CPb (refer to FIG. 3) of the semiconductor chip CP to the surface BSa of the wiring board BS.

3. Electrical Coupling Step (S13)

Next, in the electrical coupling step (S13) shown in FIG. 4, the pad electrodes PD of the semiconductor chip CP and the leads LD placed around the semiconductor chip CP on the wiring board BS are electrically coupled respectively via the wire (conductive member) BW. In the present step, the wire BW is coupled, for example, by a ball bonding (nail head bonding) method using ultrasonic vibration and thermocompression in combination for bonding of the wire BW. Example of the material of the wire BW include gold (Au) and copper (Cu), and alloys thereof.

4. Sealing Step (S14)

Next, in the sealing step (S14) shown in FIG. 4, a sealing body RS is formed and the semiconductor chip CP and the plurality of wires BW are sealed by this sealing body RS as shown in FIG. 3. In the present step, the sealing body RS shown in FIG. 3 is formed, for example, by so-called transfer molding system in which a resin is pressed into a mold, followed by curing.

5. Ball mounting step (S15)

Next, in the ball mounting step (S15) shown in FIG. 4, a plurality of solder balls (solder materials) SB are mounted on a plurality of lands BLR formed on the side of the back surface BSb of the wiring board BS shown in FIG. 3, respectively. Then, the wiring board BS having the solder balls SB thereon is subjected to heat treatment (reflow) to melt the solder balls SB and bond them to the lands BLR, respectively. More specifically, the wiring board BS is placed in a reflow furnace and heated up to a temperature higher than the melting point of the solder balls BS, for example, 260° C. or more. In such a manner, the ball mounting step (S15) is performed.

6. Division Step (S16)

Next, in the division step (S16) shown in FIG. 4, the wiring board BS (and sealing body RS) shown in FIG. 3 is cut to divide it into the semiconductor device SD1 having the semiconductor chip CP thereon. For division, for example, a method of cutting with a dicing blade (cutting blade) can be used.

The plurality of semiconductor devices SD1 obtained by the present step are still half-completed ones (assembly) before test. After the present step, those accepted as a result of the appearance inspection step and electrical test step shown in FIG. 4 are regarded as completed semiconductor devices SD1.

7. Electrical Test Step (S17)

Next, in the electrical test step (S17) shown in FIG. 4, a test is performed to confirm whether the circuit has no disconnection or the device has predetermined (within an acceptable range) electrical properties when a current is supplied to the semiconductor device. In addition, in the present step, based on the results of the electrical test, the device is classified as non-defective or defective and the defective one is removed. Electrical test devices used in the electrical test step (S17) and the electrical test step (S17) will hereinafter be described in detail.

(Electrical Test Device)

Figure 5:
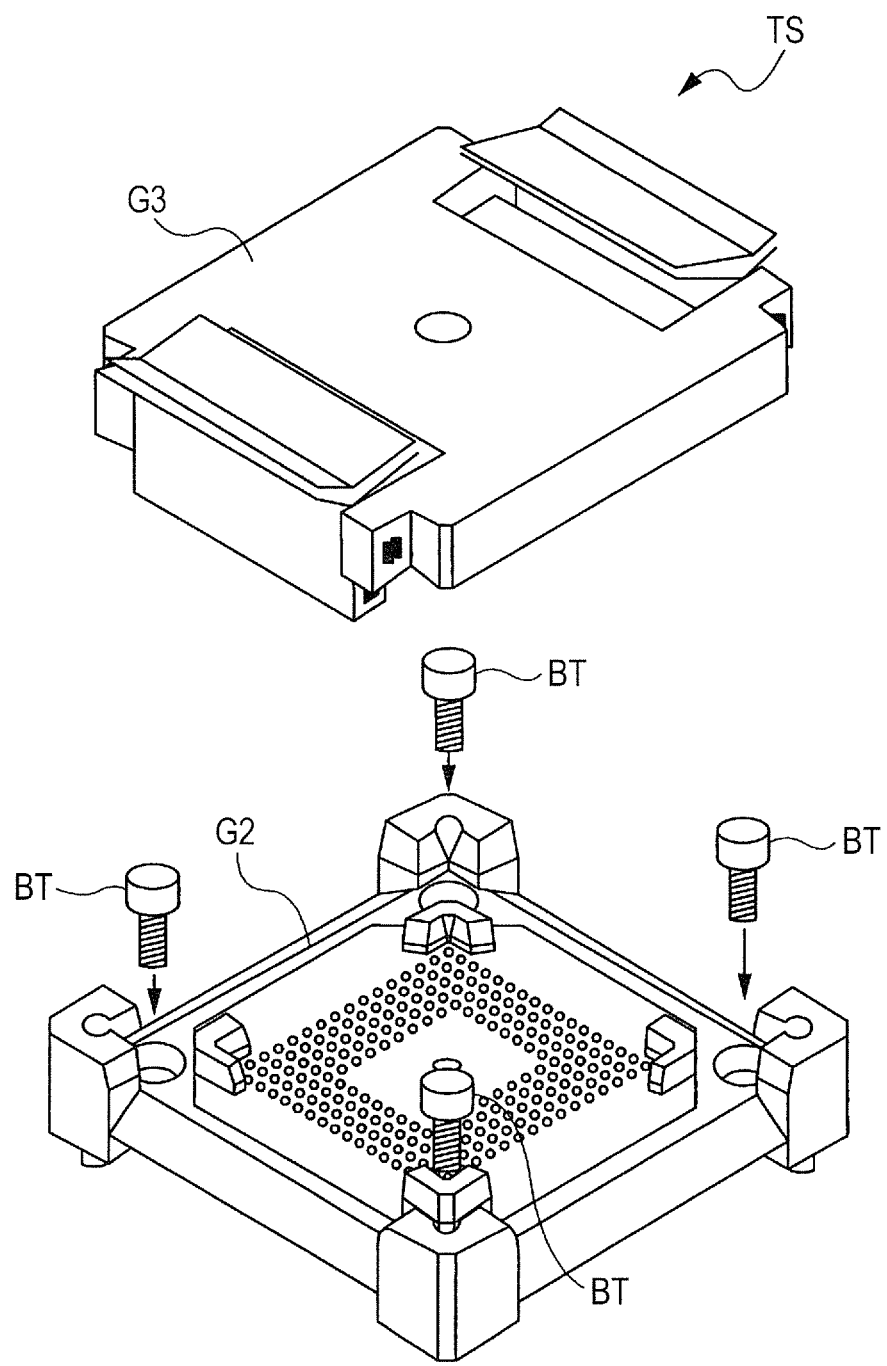
FIG. 5 is a schematic perspective view of a socket of a test device of the present embodiment.
Figure 6:
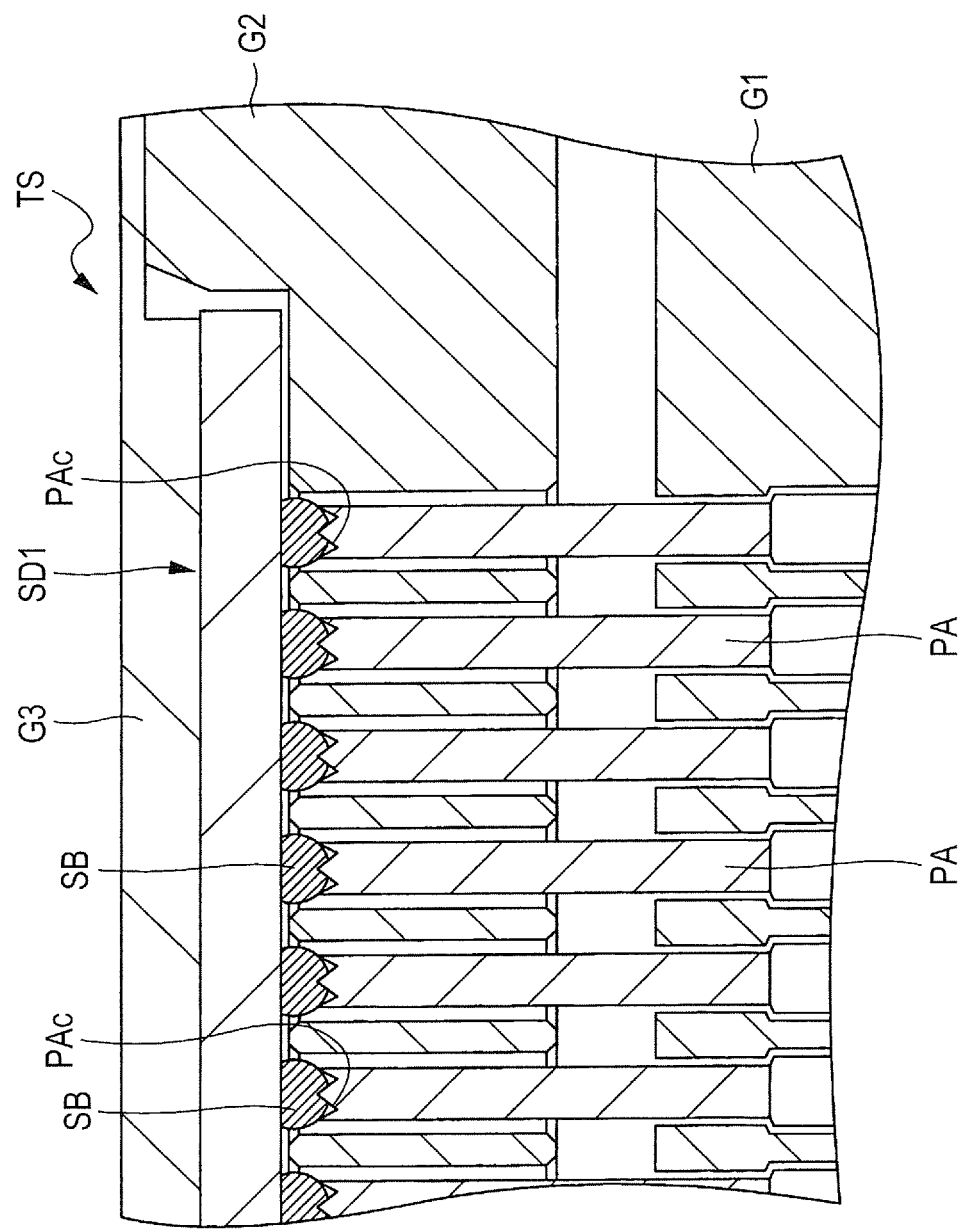
FIG. 6 is a partially enlarged fragmentary cross-sectional view of the socket of the test device having the semiconductor device of the present embodiment housed therein.

FIG. 5 is a schematic perspective view of a socket of a test device of the present embodiment and FIG. 6 is a partially enlarged fragmentary cross-sectional view of the socket of the test device having the semiconductor device of the present embodiment housed therein.

In the electrical test step (S17) of the present embodiment, a test device (electrical test device) that performs an electrical test of the semiconductor device SD1 has, as shown in FIG. 5, a socket TS for housing the semiconductor device SD1 therein, a test board (performance board) electrically coupled to the semiconductor device SD1 via the socket TS, and a test head electrically coupled to the test board. The test head has a test circuit for inputting/outputting a signal current between the test head and is electrically coupled to the semiconductor device SD1 via the test board and socket TS.

As shown in FIGS. 5 and 6, the socket TS has a plurality of probe pins (test terminals, contact pins, contact probes, probes) PA to be brought into contact with the solder balls SB of the test device SD1 at the test and a socket base (probe guide) G1 to which the probe pin PA is fixed. Further, the socket TS has a floating stand (package guide) G2 in which the semiconductor device SD1 can be housed, a bolt BT that fixes the floating stand G2 to the socket base G1, and a package press cover G3 that presses the semiconductor device SD1 mounted in the floating stand G2.

Figure 7:
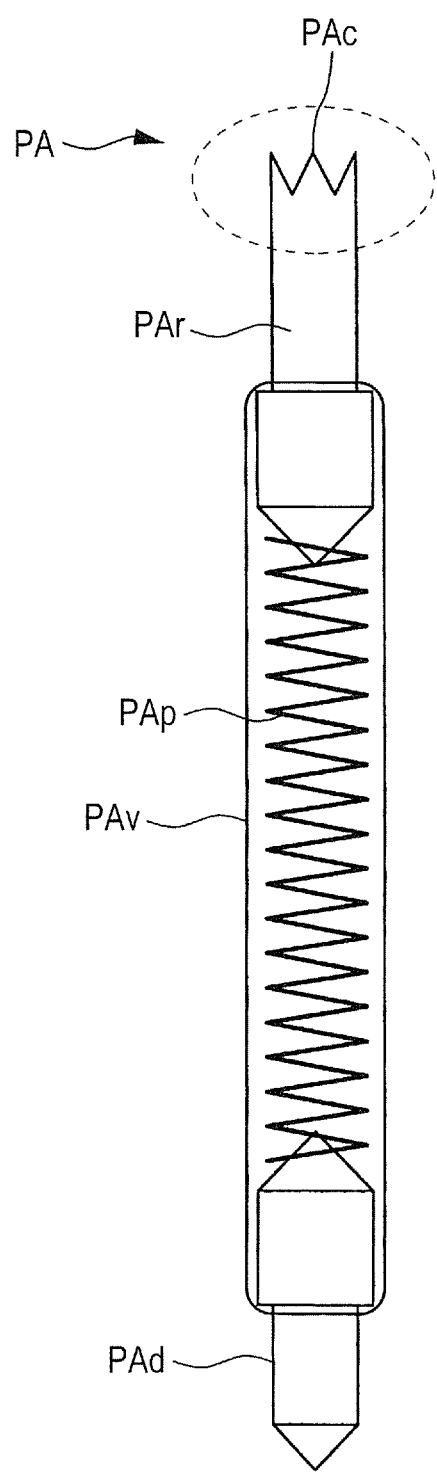
FIG. 7 is a fragmentary cross-sectional view showing the structure of a probe pin which the socket of the test device of the present embodiment has.

When the semiconductor device SD1 is mounted in the floating stand G2 while directing the plurality of solder balls SB of the semiconductor device SD1 toward the bottom surface of the floating stand G2 and the package press cover G3 is closed, tip portion PAc of contact portion PAr of the plurality of probe pins PA shown in FIG. 7 protrude from a plurality of through-holes provided on the bottom surface of the floating stand G2, respectively. The solder balls SB of the semiconductor device SD1 are therefore brought into contact with the tip portion PAc of the contact portion PAr of the probe pin PA and conduction between them can be achieved. In short, the tip portion PAc becomes a contact region of the probe pin PA. The short term "tip portion of the probe pin" will hereinafter mean "tip portion of the contact portion of the probe pin".

(Structure of Probe Pin)

Figure 8:
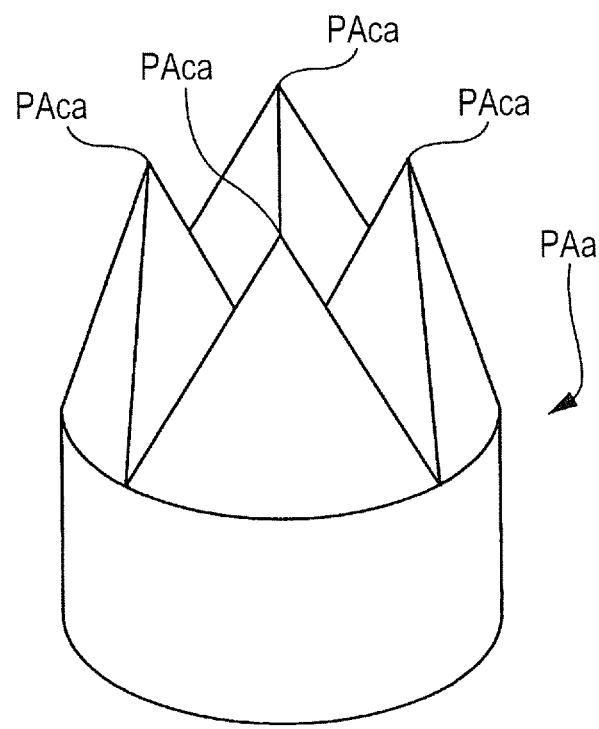
FIG. 8 is an enlarged perspective view of a tip portion of the probe pin shown in FIG. 7.
Figure 9:
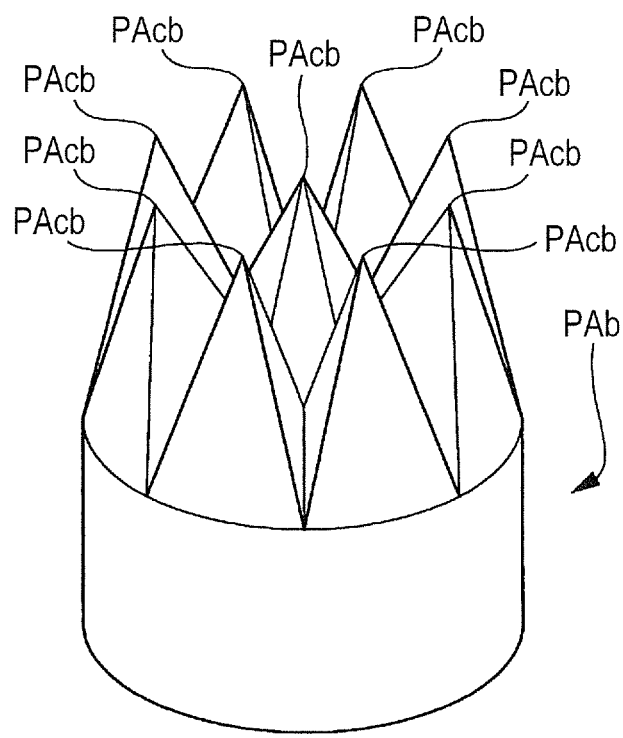
FIG. 9 is an enlarged perspective view of a tip portion of the probe pin which is a modification example of FIG. 7.

Next, the probe pin PA of the present embodiment will be described referring to FIGS. 7 to 9. FIG. 7 is a fragmentary cross-sectional view showing the structure of the probe pin which the socket of the test device of the present embodiment has, FIG. 8 is an enlarged perspective view of the tip portion of the probe pin shown in FIG. 7, and FIG. 9 is an enlarged perspective view of the tip portion of a probe pin which is a modification example of FIG. 7.

As shown in FIG. 7, the probe pin PA which is a slender pin member is comprised of a slender cylindrical main portion PAv, a contact portion PAr which is housed slidably in the main portion PAv and has a split-tip portion PAc, a spring member PAp which is housed in the main portion PAv and presses the contact portion PAr in a direction to push it from the main portion PAv, and a support portion PAd to be brought into contact with a test board electrode.

The spring member PAp is housed in the main portion PAv while being sandwiched between the support portion PAd and the contact portion PAr. During the test, therefore, a load is always applied to the contact portion PAr by the spring member PAp in a direction to press it from the main portion PAv so as to bring the tip of the contact portion PAr into contact with the solder ball SB of the semiconductor device SD1 without failure.

Further, to achieve electrical coupling with the solder ball SB of the semiconductor device SD1, the main portion PAv, the contact portion PAr, the spring member PAp, and the support portion PAd of the probe pin PA are made of a conductive material.

Still further, to reduce the contact resistance between the probe pin PA and the solder ball SB of the semiconductor device SD1, the tip portion PAc of the contact portion PAr is, as shown in FIG. 8, split and has four acute substantially trigonal pyramid-shaped protrusions. Such a tip portion PAc can reduce the contact resistance by sticking in the solder ball SB of the semiconductor device SD1 during the test and increasing the contact area between the tip portion PAc and the solder ball.

As a modification example of the protrusion PAca shown in FIG. 8, the tip portion PAc of the probe pin PA may be split and has nine substantially trigonal pyramid-shaped protrusions PAcb as shown in FIG. 9. When the probe pin having the protrusions PAcb as shown in FIG. 9 is used, the number of contact points between the solder ball SB and the probe pin PA increases compared with the four protrusions PAca shown in FIG. 8. For example, when a planar misalignment occurs between the solder ball SB and the probe pin PA due to the influence of registration or the like, there is a high possibility that some of the protrusions PAcb stick in the solder ball SB. This therefore makes it possible to secure conduction between the probe pin PA and the solder ball SB and make a stable test. From the standpoint of securing coupling reliability, use of the probe pin PA having nine protrusions PAcb is preferred.

(Structure of Tip Portion of Probe Pin)

Figure 10:
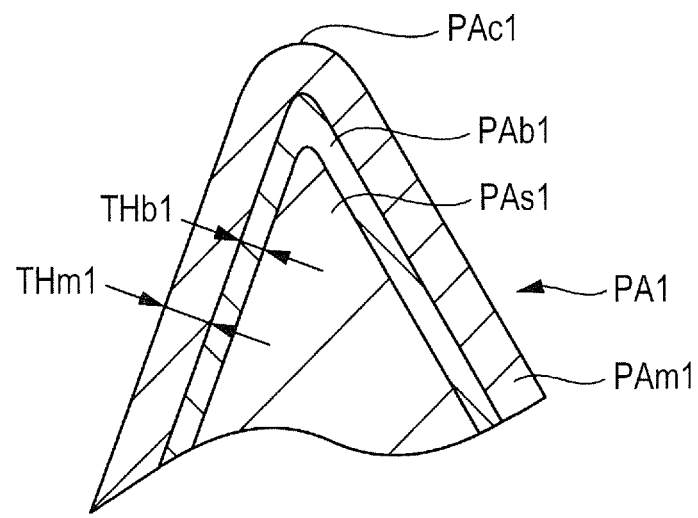
FIG. 10 is an enlarged cross-sectional view of the tip portion of a probe pin according to First Embodiment.

FIG. 10 is an enlarged cross-sectional view of the tip portion of a probe pin of First Embodiment. The probe pin PA of First Embodiment will hereinafter be called "probe pin PA1".

As shown in FIG. 10, a tip portion PAc1 of the contact portion PAr of the probe pin PA1 of First Embodiment is comprised of a base material PAs1, a nickel film PAb1 formed on the base material PAs1, and a conductive film PAm1 formed on the nickel film PAb1 and made of silver.

The base material PAs1 is made of a material containing copper (Cu), for example, beryllium copper (BeCu) or a carbon steel material (SK material). The nickel film PAb1 is made of nickel (Ni). The nickel film PAb1 is formed as a diffusion preventive layer of copper contained in the base material PAs1, an adhesion layer between the base material PAs1 and the conductive film PAm1, and a power feed layer for forming the conductive film PAm1 by plating. The nickel film PAb1 is suited for preventing copper diffusion, but a too thick nickel film is likely to be cracked due to a film stress so that a thin one is preferred. As shown in FIG. 10, the conductive film PAm1 is thicker than the nickel film PAb1.

The silver configuring the conductive film PAm1 has preferably a Vickers hardness of 100 HV or more (hard silver), with silver (hard silver) having 170 HV or more being more preferred from the standpoint of wear resistance.

The term "Vickers hardness" as used herein is a value obtained in Vickers hardness test by dividing a test load [N] by the surface area [mm$^2$] of a permanent indentation. The Vickers hardness test is a method of determining the hardness by pushing a diamond indenter in the form of a right pyramid with a square base and an angle of 136 degrees between opposite faces into the surface of a material and calculating the surface area [mm$^2$] from the length [mm] of the diagonals of the indentation left after removal of the load. In the following description, the hardness is expressed by Vickers hardness with a unit of HV.

In general, silver having a Vickers hardness of 100 HV or more is called "hard silver" and hard silver of 170 HV or more is particularly excellent in wear resistance.

There is a close relation between the crystal particle size and hardness of fine silver crystals. Roughly speaking, silver having a particle size of 0.2 μm or less is hard silver and that having a particle size greater than it is soft silver. The hard silver and soft silver can be produced respectively by controlling the film forming conditions such as current density at the time of electroplating. Hard silver having a small particle size can be obtained efficiently by the addition of an element such as antimony or selenium to a plating solution because such an element controls crystal growth of fine silver crystals during the plating step.

(Electrical Test Step)

Next, the electrical test step (S17) will be described in detail.

First, the semiconductor device SD1 shown above in FIGS. 1 to 3 and the socket TS shown in FIG. 5 are provided. The semiconductor device SD1 is mounted in the floating stand G2 while facing the plurality of solder balls SB of the semiconductor device SD1 to the bottom surface of the floating stand G2. Then, the package press cover G3 is closed to protrude the tip portion of the contact portion PAr of the probe pin PA from the through-hole provided on the bottom surface of the floating stand G2. As a result, as shown in FIG. 6, the solder ball SB of the semiconductor device SD1 is brought into contact with the tip portion PAc of the contact portion PAr of the probe pin PA.

To reduce the contact resistance between the probe pin PA and the solder ball SB and carry out the electrical test stably, it is preferred to adjust the contact load between the probe pin PA and the solder ball SB, for example, at from 20 gf (about 0.2N) to 50 gf (about 0.5N) to cause the tip portion PAc of the probe pin PA to stick in the solder ball SB. The term "contact load" as used herein means a load which the solder ball SB receives from the probe pin PA at the time of contact.

The electrical test is performed by sending a predetermined electric signal from an outside test circuit (not shown) to the semiconductor device SD1. During the test, the power is supplied to the semiconductor device SD1 via the probe pin PA and a signal current sent from the semiconductor device SD1 is measured to confirm that the circuit has no disconnection or electrical properties of the device are predetermined ones (within an acceptable range). Based on the results of the electrical test, products are determined whether they are defective or non-defective and defective products are removed. They are sorted, for example, by conveying defective products and non-defective products to respectively different destinations when they are taken out from the socket TS.

INVESTIGATION EXAMPLE

Figure 11:
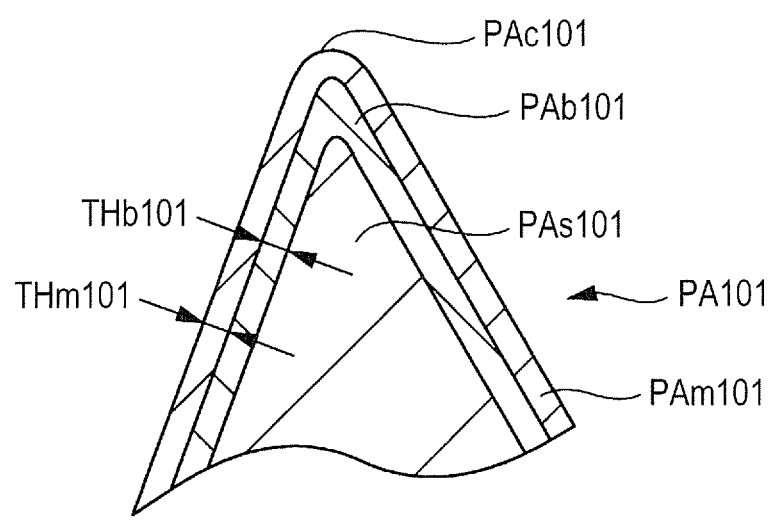
FIG. 11 is an enlarged cross-sectional view of the tip portion of a probe pin of Investigation Example 1.
Figure 12:
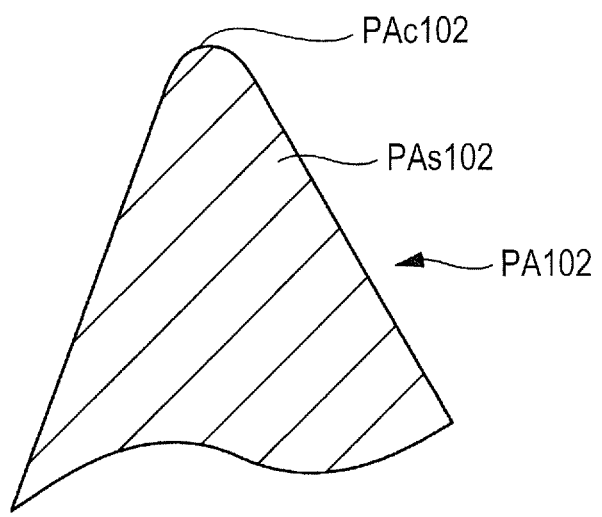
FIG. 12 is an enlarged cross-sectional view of the tip portion of a probe pin of Investigation Example 2.
Figure 13:
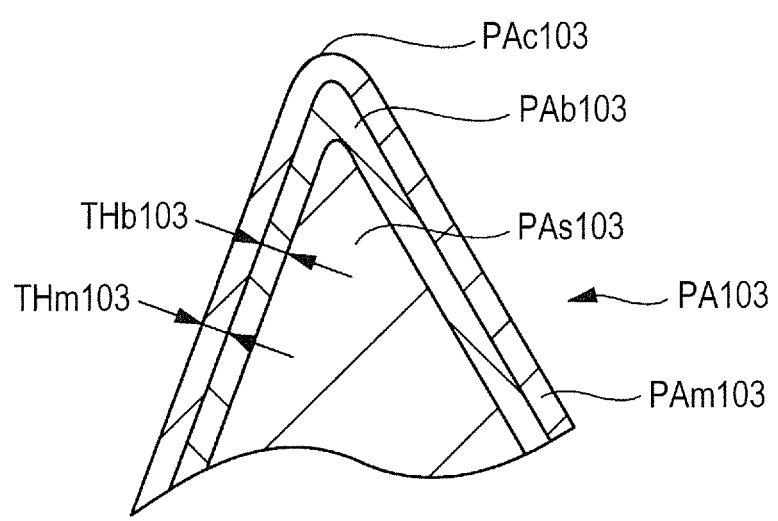
FIG. 13 is an enlarged cross-sectional view of the tip portion of a probe pin of Investigation Example 3.
Figure 14:
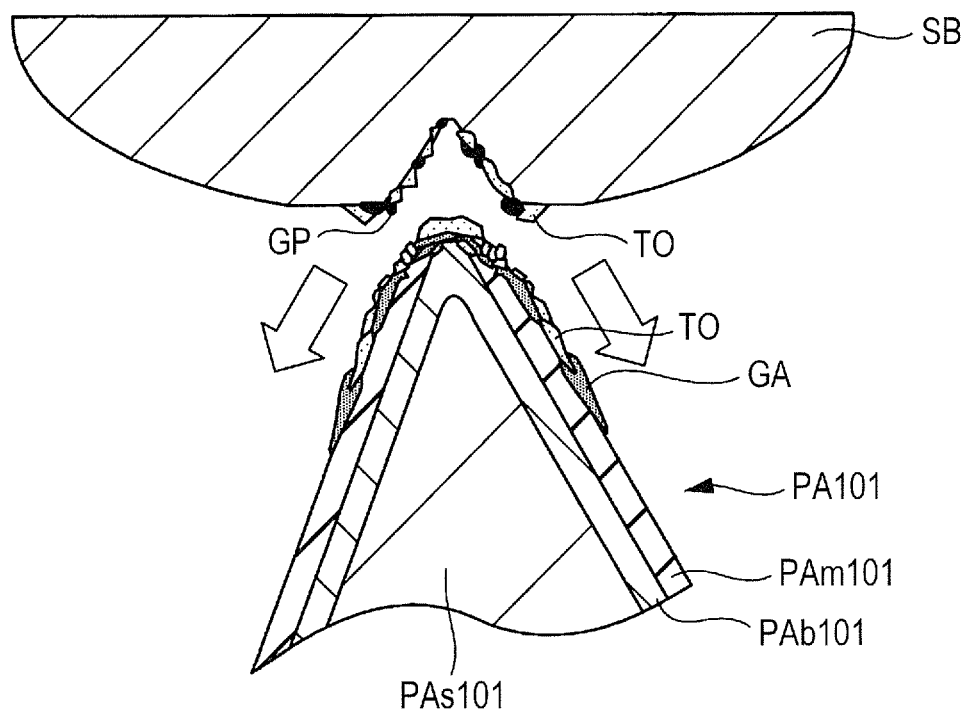
FIG. 14 is an enlarged cross-sectional view of the tip portion of the probe pin of Investigation Example 1 shown in FIG. 11 after brought into contact with a solder film.
Figure 15:
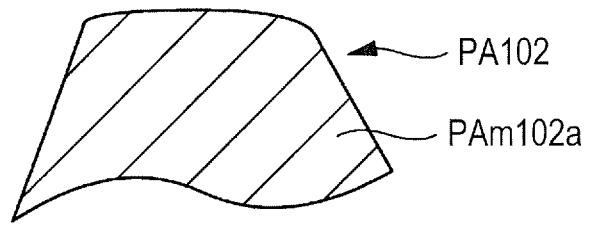
FIG. 15 is an enlarged cross-sectional view showing the flattened tip portion of the probe pin of Investigation Example 2 shown in FIG. 12.

The present inventors have investigated a probe pin which an electrical test device has as follows. FIG. 11 is an enlarged cross-sectional view of the tip portion of a probe pin of Investigation Example 1, FIG. 12 is an enlarged cross-sectional view of the tip portion of a probe pin of Investigation Example 2, and FIG. 13 is an enlarged cross-sectional view of the tip portion of a probe pin of Investigation Example 3. FIG. 14 is an enlarged cross-sectional view of the tip portion of the probe pin of Investigation Example 1 shown in FIG. 11 after brought into contact with a solder film and FIG. 15 is an enlarged cross-sectional view showing a flattened tip portion of the probe pin of Investigation Example 2 shown in FIG. 12. The probe pins PA of Investigation Example 1, Investigation Example 2, and Investigation Example 3 will hereinafter be called "probe pin PA101", "probe pin PA102", and "probe pin PA103", respectively.

Investigation Example 1

As shown in FIG. 11, a tip portion PAc101 of the probe pin PA101 which an electrical test device of Investigation Example 1 has is comprised of a base material PAs101, a nickel film PAb101 formed on the base material PAs101, and a conductive film PAm101 formed on the nickel film PAb101.

The base material PAs101 is made of beryllium copper (BeCu) or a carbon steel material (SK material). The nickel film PAb101 is made of nickel (Ni) for preventing diffusion of copper contained in the base material PAs101. The conductive film PAm101 is made of gold (Au) for preventing oxidation of the surface of the tip portion PAc101 and reducing contact resistance. As shown in FIG. 11, the nickel film PAb101 has a thickness THb101 of 1.5 µm and the conductive film PAm101 has a thickness THm101 of 1.5 µm. The conductive film PAm101 is preferably thinner from the standpoint of cost, though it can be thickened to improve wear resistance and contact properties.

Here, a description will be made with the solder ball SB, which is an external terminal of the BGA type semiconductor device SD1 shown in FIG. 3, as an example with which the tip portion PAc101 of the probe pin PA101 is brought into contact as shown in FIG. 14. The external terminal of the semiconductor device may be a solder film (not shown) on the land of an LGA type semiconductor device or a solder film SF2 formed on an outer lead portion OL of a QFP type semiconductor device SD2 which is one of a leadframe type device of Modification Example 1 shown later in FIG. 23.

First, when the tip portion PAc101 of the probe pin PA101 is brought into contact with the solder ball SB repeatedly, the conductive film PAm101 that covers the uppermost layer of the tip portion PAc101 wears or separates. This is physical wear and is called "sliding wear". Such sliding wear is likely to proceed when brought into contact with a soft member.

When such sliding wear proceeds, the nickel film PAb101 is exposed at the tip potion PAc101 of the probe pin PA101. Since nickel configuring the nickel film PAb101 is easily oxidized, exposure of the nickel film PAb101 leads to formation of a nickel oxide film at the tip portion PAc101.

When an electrical test is performed using such a probe pin PA101, a nickel oxide film which is an insulator inevitably causes an increase in contact resistance between the tip portion PAc101 and the solder ball SB or variation in contact resistance. Described specifically, the nickel oxide film formed at the tip portion PAc101 of the probe pin PA101 becomes a cause of a conduction error due to an increase in contact resistance or a cause of an increase in measurement error due to an increase in variation in contact resistance. As a result, the probe pin PA101 has deteriorated electrical properties.

In particular, an oxidation reaction of nickel is likely to proceed in an electrical test under high-temperature or high-humidity conditions so that the probe pin PA101 is likely to have deteriorated electrical properties.

On the other hand, due to contact between different kinds of metals, intermetallic diffusion reaction proceeds to form an intermetallic compound, that is, an alloy. Contact of the tip portion PAc101 of the probe pin PA101 with the solder ball SB in repetition forms a gold-tin alloy GA on the conductive film PAm101 as shown in FIG. 14. In particular, gold configuring the conductive film PAm101 has high affinity for tin which is the main component of the solder ball SB (chemically bonds to tin easily) so that it forms an alloy GA easily. Further, as shown in FIG. 14, when the alloy GA adsorbs to the solder ball SB, a portion of the conductive film PAm101 separates as a separation piece GP, together with the alloy GA. Such wear is called "diffusion wear". This separation piece GP tends to separate at the interface between the conductive film PAm101 and the nickel film PAb101, facilitating exposure of the nickel film PAb101.

As a result, since such diffusion wear proceeds, as when sliding wear proceeds, exposure of the nickel film PAb101 at the tip portion PAc101 of the probe pin PA101 occurs, resulting in oxidation of nickel configuring the nickel film PAb101 and formation of a nickel oxide film at the tip portion PAc101. As described above, the nickel oxide film formed at the tip portion PAc101 of the probe pin PA101 becomes a cause of conduction error due to an increase in contact resistance or a cause of an increase in measurement error due to an increase in variation in contact resistance. As a result, the probe pin PA101 has deteriorated electrical properties. In particular, at an electrical test under high temperature conditions, diffusion wear is likely to proceed and then, the probe pin PB101 has deteriorated electrical properties.

Diffusion wear however does not always lead to separation of the conductive film PAm101 even if it proceeds and therefore, the nickel film PAb101 is not exposed. In this case, the alloy GA is attached to the surface of the conductive film PAm101. From the alloy GA of gold and tin, tin diffuses easily so that tin is exposed from the surface of the alloy GA. Since tin is oxidized easily, when tin is exposed, a tin oxide film TO is formed on the uppermost layer of the alloy GA. This means that the tin oxide film TO is formed on the surface of the tip portion PAc101 of the probe pin PA101.

When an electrical test is performed using such a probe pin PA101, the tin oxide film TO which is an insulator inevitably causes an increase in contact resistance between the tip portion PAc101 and the solder ball SB or variation in contact resistance. Described specifically, the tin oxide film TO formed at the tip portion PAc101 of the probe pin PA101 becomes a cause of a conduction error due to an increase in contact resistance or a cause of an increase in measurement error due to an increase in variation in contact resistance. As a result, the probe pin PA101 has deteriorated electrical properties.

Thus, in the case of the probe pin PA101 of Investigation Example 1, the probe pin has deteriorated electrical properties due to both sliding wear and diffusion wear.

Investigation Example 2

The tip portion PAc102 of the probe pin PA102 which the electrical test device of Investigation Example 2 has, is made only of a base material PAs102 as shown in FIG. 12. The base material PAs102 is made of a palladium (Pd) alloy. More specifically, it is a palladium-silver-copper (Pd—Ag—Cu)-based alloy and it contains them at a weight ratio of, for example, 4:3:3 in the order of mention.

The electrical resistivity of a simple substance of palladium is almost equal to that of iron (Fe), but by the addition of a sub-element, the electrical resistivity of the palladium alloy can be made lower than that of a simple substance of palladium. The electrical resistivity can be reduced by incorporating a sub-element such as silver or copper which has an electrical resistivity lower than that of palladium, a main element, and thereby forming an alloy. The "electrical resistivity of an element" is assessed as electrical resistivity in the case of a metal made only of the element. For example, an element having electrical resistivity lower than that of palladium is an element having electrical resistivity lower than that of a metal made only of palladium. Silver or copper corresponds to it.

Since the tip portion PAc102 of the probe pin PA102 of Investigation Example 2 is made of a single material, no change in material occurs after the tip portion PAc102 wears. In the probe pin PA102 of Investigation Example 2, therefore, deterioration in electrical properties of the probe pin due to separation of the conductive film as in the probe pin PA101 of Investigation Example 1 does not occur.

Palladium configuring the base material PAs102 has low affinity for tin (Sn) which is a main component of the solder film SF so that in an electrical test at normal temperature, adhesion of the solder film SF to the surface of the base material PAs102 can be reduced.

It has however been revealed by the investigation by the present inventors that in an electrical test under high-temperature conditions, a portion of the solder film SF adheres to the surface of the base material PAs102 and a palladium-tin alloy is formed on the base material PAs102.

When the alloy has adhered to the base material PAs102, tin diffuses more easily from the palladium-tin alloy so that tin is exposed from the surface of the alloy. Tin is oxidized easily so that when tin is exposed, a tin oxide film is formed on the uppermost layer of the alloy. In an electrical test using such a probe pin PA102, the tin oxide film which is an insulator inevitably causes an increase in contact resistance between the tip portion PAc102 and the solder film SF or variation in contact resistance. Described specifically, the tin oxide film formed at the tip portion PAc102 of the probe pin PA102 becomes a cause of a conduction error due to an increase in contact resistance or a cause of an increase in measurement error due to an increase in variation in contact resistance. As a result, the probe pin PA102 has deteriorated electrical properties.

Further, the investigation by the present inventors has revealed that when the probe pin PA102 is used under high temperature conditions, so-called a "biting" phenomenon occurs, in which an alloy of palladium configuring the base material PAs102 and tin configuring the solder film SF adheres to the side of the solder film SF, causing separation of a portion of the base material PAs102. As a result, as shown in FIG. 15, the tip portion PAc102 of the probe pin PA102 wears much and is flattened. In an electrical test using such probe pin PA102, the tip portion PAc102 has difficulty in sticking in the solder film SF and a contact area between the tip portion PAc102 and the solder film SF decreases, causing an increase in contact resistance or variation in contact resistance.

Still further, it has been revealed by the investigation by the present inventors that tin configuring the solder film SF is likely to deposit on the portion of the tip portion PAc102 of the probe pin PA102 which is flattened as a result of wear and a tin oxide film is formed easily at the tip portion PAc102 of the probe pin PA102. This means that the tin oxide film formed at the tip portion PAc102 of the probe pin PA102 becomes a cause of a conduction error due to an increase in contact resistance or a cause of an increase in measurement error due to an increase in variation in contact resistance.

In the case of the probe pin PA102 of Investigation Example 2, the sliding wear as in Investigation Example 1 can be reduced, but deterioration in electrical properties of the probe pin due to diffusion wear cannot be overcome.

Investigation Example 3

As shown in FIG. 13, a tip portion PAc103 of the probe pin PA103 which the electrical test device of Investigation Example 3 has is comprised of a base material PAs103, a nickel film PAb103 formed on the base material PAs103, and a conductive film PAm103 formed on the nickel film PAb103.

The base material PAs103 is made of beryllium copper (BeCu) or a carbon steel material (SK material). The nickel film PAb103 is made of nickel (Ni). The conductive film PAm103 is made of silver (Ag). As shown in FIG. 13, a thickness THb103 of the nickel film PAb103 is equal to a thickness THm103 of the conductive film PAm103. Here, the thickness Thb103 of the nickel film PAb103 is 1.5 μm and the thickness Thm103 of the conductive film PAm103 is 1.5 μm.

Similar to Investigation Example 1, when the tip portion PAc103 of the probe pin PA103 of Investigation Example 3 is brought into contact with the solder film SF in repetition, silver configuring the conductive film PAm103 and tin configuring the solder film SF form an alloy. In the alloy of silver and tin, silver diffuses more easily than tin. Silver is exposed from the surface of the alloy and tin is not exposed so easily. This prevents formation of a tin oxide film on the uppermost layer of the alloy. As a result, the probe pin PA103 of Investigation Example 3 can be prevented from deterioration in electrical properties, which is the problem of the probe pin PA101 of Investigation Example 1 and the probe pin PA102 of Investigation Example 2 and is caused by the formation of a tin oxide film on the uppermost layer due to diffusion wear.

As described in Investigation Example 1, however, when the tip portion PAc103 of the probe pin PA103 is brought into contact with the solder film SF in repetition, the conductive film PAm103 that covers the uppermost layer of the tip portion PAc103 wears or separates due to sliding wear.

As such sliding wear proceeds, the nickel film PAb103 is exposed from the tip portion PAc103 of the probe pin PA103. As described above, since nickel is easily oxidized, when the nickel film PAb103 is exposed, a nickel oxide film is formed at the tip portion PAc103. In an electrical test performed using such a probe pin PA103, an increase in contact resistance between the tip portion PAc103 and the solder film SF or variation in contact resistance may occur due to the nickel oxide film serving as an insulator. This means that a nickel oxide film formed at the tip portion PAc103 of the probe pin PA103 becomes a cause of a conduction error due to an increase in contact resistance or a cause of an increase in measurement error due to an increase in variation in contact resistance. As a result, the probe pin PA103 has deteriorated electrical properties.

Thus, the probe pin PA103 of Investigation Example 3 can reduce diffusion wear which Investigation Examples 1 and 2 has as a problem, but it does not overcome the deterioration in electrical properties of the probe pin due to sliding wear. Based on Investigation Examples 1 to 3, there is a demand for reducing diffusion wear and sliding wear simultaneously in order to prevent deterioration in electrical properties of a probe pin.

The above-described investigation can be applied not only to the probe pin as described in Investigation Examples 1 to 3 but also to all the test terminals used in an electrical test such as a socket terminal having a flat spring structure described later.

<Main Characteristics of Present Embodiment>

The method of manufacturing a semiconductor device according to the present embodiment will hereinafter be described while comparing with that of Investigation Examples.

First Embodiment

As shown in FIG. 10, the tip portion PAc1 of the contact portion PAr of the probe pin PA1 which the electrical test device of First Embodiment has, is comprised of the base material PAs1, the nickel film PAb1 formed on the base material PAs1, and the conductive film PAm1 formed on the nickel film PAb1 and made of silver. The thickness THm1 of the conductive film PAm1 is greater than the thickness THb1 of the nickel film PAb1.

In the probe pin PA1 of First Embodiment, the tip portion PAc1 has, as the uppermost layer thereof, the conductive film PAm1 made of silver. Even if the tip portion PAc1 of the probe pin PA1 is brought into contact with a solder ball or solder film in repetition and an alloy is formed on the surface of the conductive film PAm1, tin is not easily exposed from the surface of the alloy because silver is more diffusible than tin as described in Investigation Example 3. As a result, formation of a tin oxide film on the uppermost layer of the conductive film PAm1 is prevented and compared with Investigation Examples 1 and 2, the probe pin PA1 of First Embodiment can be prevented from deterioration in electrical properties which will otherwise occur by the formation of a tin oxide film on the uppermost layer due to sliding wear.

Further in the probe pin PA1 of First Embodiment, the thickness Thm1 of the conductive film PAm1 is made greater than the thickness THb1 of the nickel film PAb1. As described above, when the nickel film PAb1 is too thick, the nickel film PAb1 is easily cracked by a film stress so that the thickness THb1 of the nickel film PAb1 is desirably made smaller to some extent. On the other hand, in the case of the conductive film PAm1 present as the uppermost layer, the thickness THm1 of the conductive film PAm1 is desirably made greater to prevent exposure of the nickel film PAb1 even when sliding wear occurs. Therefore, by making the thickness THm1 of the conductive film PAm1 greater than the thickness THb1 of the nickel film PAb1, the conductive film PAm1 can be thickened while thinning the nickel film PAb1. By thinning of the nickel film PAb1, a film stress can be reduced and the nickel film PAb1 can be prevented from cracking. In addition, since the conductive film PAm1 is made thicker, exposure of the nickel film PAb1 can be prevented even if the tip portion PAc1 of the probe pin PA1 is brought into contact with a solder ball or solder film in repetition and sliding wear of the conductive film PAm1 occurs. Exposure of the nickel film PAb1 is prevented so that the tip portion PAc1 does not easily have a nickel oxide film on the uppermost layer thereof. As a result, compared with Investigation Examples 1 and 3, the probe pin PA1 of First Embodiment can be effectively prevented from deterioration in electrical properties which will otherwise be caused by the formation of a nickel oxide film on the uppermost layer due to sliding wear.

In the probe pin PA103 of Investigation Example 3, the thickness THm103 of the conductive film PAm103 is equal to the thickness THb103 of the nickel film PAb103. When the conductive film PAm103 is thickened, the nickel film PAb103 also becomes thick. With an increase in the thickness of the nickel film PAb103, the film stress of the nickel film PAb103 increases and there is a possibility of the nickel film PAb103 being cracked. Therefore, in the probe pin PA103 of Investigation Example 3, it is difficult to satisfy both prevention of the exposure of the nickel film PAb103 due to sliding wear and suppression of the film stress of the nickel film PAb103. In the probe pin PA1 in First Embodiment, on the other hand, since the conductive film PAm1 is thicker than the nickel film PAb1 and the conductive film PAm1 can be thickened while thinning the nickel film PAb1, both prevention of exposure of the nickel film PAb103 due to sliding wear and suppression of the film stress of the nickel film PAb103 can be satisfied.

As described above, compared with Investigation Examples 1 to 3, the probe pin PA1 of First Embodiment can be prevented from having deteriorated electrical properties because by making the thickness THm1 of the conductive film PAm1 present as the uppermost layer of the tip portion PAc1 greater than the thickness THb1 of the nickel film PAb1, diffusion wear and sliding wear of the conductive film PAm1 can be reduced simultaneously while preventing cracking of the nickel film PAb1.

Further, to prevent exposure of the nickel film PAb1 due to sliding wear of the conductive film PAm1, improvement in wear resistance of the conductive film PAm1 to reduce the sliding wear itself is desired. In the probe pin PA1 of First Embodiment, it is therefore preferred to use silver (hard silver) having a Vickers hardness of 100 HV or more as the silver configuring the conductive film PAm1, with silver (hard silver) having a Vickers hardness of 170 HV or more being more preferred from the standpoint of wear resistance. When the conductive film PAm1 is made of silver (hard silver) having a Vickers hardness of 100 HV or more, more preferably silver (hard silver) having 170 HV or more, the conductive film PAm1 has improved wear resistance so that even when the tip portion PAc1 of the probe pin PA1 is brought into contact with a solder ball or a solder film in repetition, the conductive film PAm1 that covers the uppermost layer of the tip portion PAc1 neither wears nor separates easily. The nickel film PAb1 is not exposed easily so that formation of a nickel oxide film on the uppermost layer of the tip portion PAc1 is prevented. As a result, the probe pin PA1 of First Embodiment has, in addition to the above-described advantage, the advantage that the conductive film PAm1 made of silver (hard silver) having a Vickers hardness of 100 HV or more, more preferably silver (hard silver) having 170 HV or more can more effectively prevent the probe pin from having deteriorated electrical properties which will otherwise be caused by formation of a nickel oxide film on the uppermost layer due to sliding wear.

Here, the thickness THb1 of the nickel film PAb1 and the thickness THm1 of the conductive film PAm1 in First Embodiment will be described. As described above, the nickel film PAb1 of the probe pin PA1, has preferably a thickness THb1 of 1.0 µm or more in order to surely prevent diffusion of copper contained in the base material PAs1 by the nickel film PAb1. On the other hand, when the nickel film PAb1 is too thick, it cracks due to a film stress so that the nickel film PAb1 has preferably a thickness THb1 of 2.0 µm or less to prevent cracking of the nickel film PAb1 due to film stress.

The thickness THm1 of the conductive film PAm1 is preferably as large as possible to prevent exposure of the nickel film PAb1 even when sliding wear of the conductive film PAm1 occurs, but when the conductive film PAm1 is made too thick, the tip portion PAc1 of the probe pin PA1 is rounded, which may increase the contact resistance with a device to be tested. To keep sharpness of the tip portion PAc1 of the probe pin PA1, the thickness THm1 of the conductive film PAm1 and the thickness THb1 of the nickel film PAb1 are preferably 8.0 µm or less in total. Therefore, it is most suited that the thickness THm1 of the conductive film PAm1 is from 3.0 µm to 6.0 µm and the thickness THb1 of the nickel film PAb1 is 1.5 µm.

The probe pin PA1 of First Embodiment can effectively prevent, as described above, formation of a nickel oxide film or a tin oxide film on the tip portion PAc1 so that it can be used as a probe pin in an electrical test under high temperature conditions. In particular, silver is not oxidized easily at normal temperature and even if silver oxide is formed, it releases oxygen from its surface under high temperature conditions and is reduced to silver so that it is suited as a probe pin for an electrical test under high temperature conditions.

Any of probe pins of Second Embodiment, Third Embodiment, Modification Example 1, and Modification Example 2 which will be described later can be used as a probe pin in an electrical test under high temperature conditions because it has a conductive film made of silver on the uppermost layer of the tip portion of the probe pin.

Second Embodiment

Figure 16:
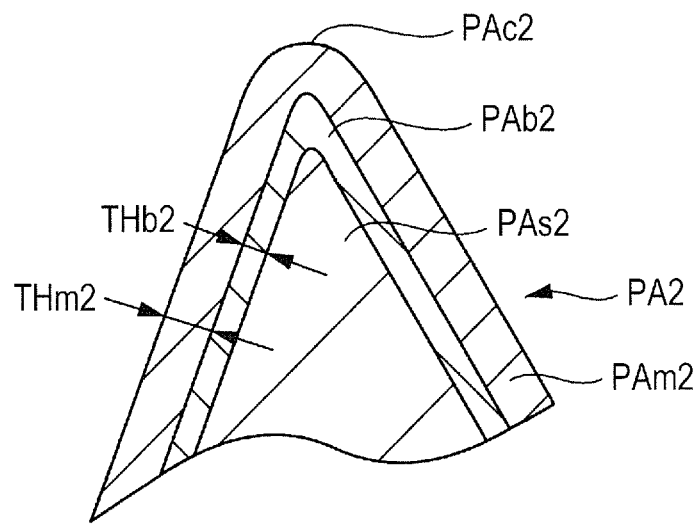
FIG. 16 is an enlarged cross-sectional view of the tip portion of a probe pin of Second Embodiment.

FIG. 16 is an enlarged cross-sectional view of the tip portion of a probe pin of Second Embodiment. The probe pin PA of Second Embodiment will hereinafter be called "probe pin PA2".

As shown in FIG. 16, the tip portion PAc2 of the contact portion PAr of the probe pin PA2 of Second Embodiment is comprised of a base material PAs2, a nickel film PAb2 formed on the base material PAs2, and a conductive film PAm2 formed on the nickel film PAb2.

The materials configuring the base material PAs2 and the nickel film PAb2 of the probe pin PA2 of Second Embodiment are similar to those of the base material PAs1 and the nickel film PAb1 of the probe pin PA1 of First Embodiment, respectively. The thickness THb2 of the nickel film PAb2 and the thickness THm2 of the conductive film PAm2 of the probe pin PA2 of Second Embodiment are equal to the thickness THb1 of the nickel film PAb1 and the thickness THm1 of the conductive film PAm1 of the probe pin PA1 of First Embodiment, respectively.

The conductive film PAm2 of Second Embodiment is made of diamond-containing silver and in this point, the probe pin PA2 of Second Embodiment is different from the probe pin PA1 of First Embodiment. The term "diamond-containing silver" as used herein means a silver conductive film having diamond nanoparticles dispersed therein. Diamond-containing silver has diamond nanoparticles on the film surface thereof and is therefore superior in the following characteristics to diamond-free silver. First, diamond particles present on the film surface improve sliding properties of the contact surface compared with a simple substance of silver. Next, since the contact manner changes from surface contact to multipoint contact due to diamond particles present on the film surface, contact resistance becomes smaller compared with the simple substance of silver and contact point stability can be achieved. In addition, diamond particles enhance the viscosity of the film, making it difficult to cause separation of the film due to friction compared with the simple substance of silver.

As described above, improvement in wear resistance of the conductive film PAm2 to reduce the sliding wear itself is desired for preventing exposure of the nickel film PAb2 due to sliding wear of the conductive film PAm2. As silver configuring the conductive film PAm2 of the probe pin PA2 of Second Embodiment, diamond-containing silver is used. The conductive film PAm2 comprised of diamond-containing silver has further improved wear resistance compared with the conductive film PAm1 of First Embodiment not containing diamond.

Even if the tip portion PAc2 of the probe pin PA2 of Second Embodiment is brought into contact with a solder ball or solder film in repetition, the conductive film PAm2 that covers the uppermost layer of the tip portion PAc2 neither wears nor separates easily compared with the probe pin PA1 of First Embodiment. Since exposure of the nickel film PAb2 due to sliding wear of the conductive film PAm2 is prevented, a nickel oxide film is not formed on the tip portion PAc2. As a result, compared with the probe pin PA1 of First Embodiment, the probe pin PA2 of Second Embodiment can be prevented more from having deteriorated electrical properties which will otherwise occur by the formation of a nickel oxide film due to sliding wear.

Except for the material configuring the conductive film PAm2 of the probe pin PA2 of Second Embodiment, the probe pin of Second Embodiment is similar to that of First Embodiment and it has similar advantages to those of the probe pin PA1 of First Embodiment described above. The thickness THm2 of the conductive film PAm2 and the thickness THb2 of the nickel film PAb2 of Second Embodiment are also similar to those of First Embodiment, respectively and it is most preferred that the conductive film PAm2 has a thickness THm2 of from 3.0 µm to 6.0 µm and the nickel film PAb2 has a thickness THb2 of 1.5 µm.

Primary particles of the diamond nanoparticles contained in the conductive film PAm2 have preferably a particle size of from 3 nm to 6 nm to enhance sliding properties and contact properties, with a particle size of 5 nm or less being more preferred to decrease the contact resistance with a device to be tested.

The diamond-containing silver configuring the conductive film PAm2 has a Vickers hardness of from about 110 HV to 150 HV. The diamond-containing silver has wear resistance higher than silver having a Vickers hardness equal thereto.

(Comparison Between Experimental Results)

Figure 17:
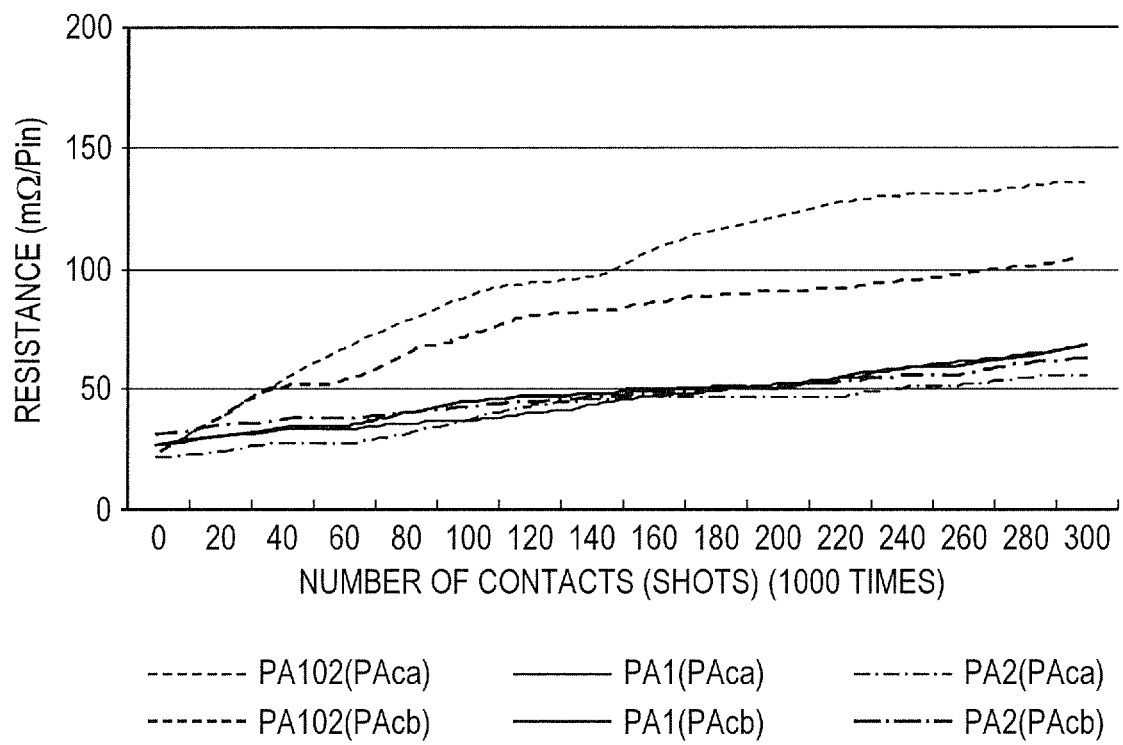
FIG. 17 is a graph showing the relation between the number of contacts and contact resistance when the probe pins of Investigation Example 2, First Embodiment, and Second Embodiment are brought into contact at a contact load of 35 gf.
Figures 18, 19:
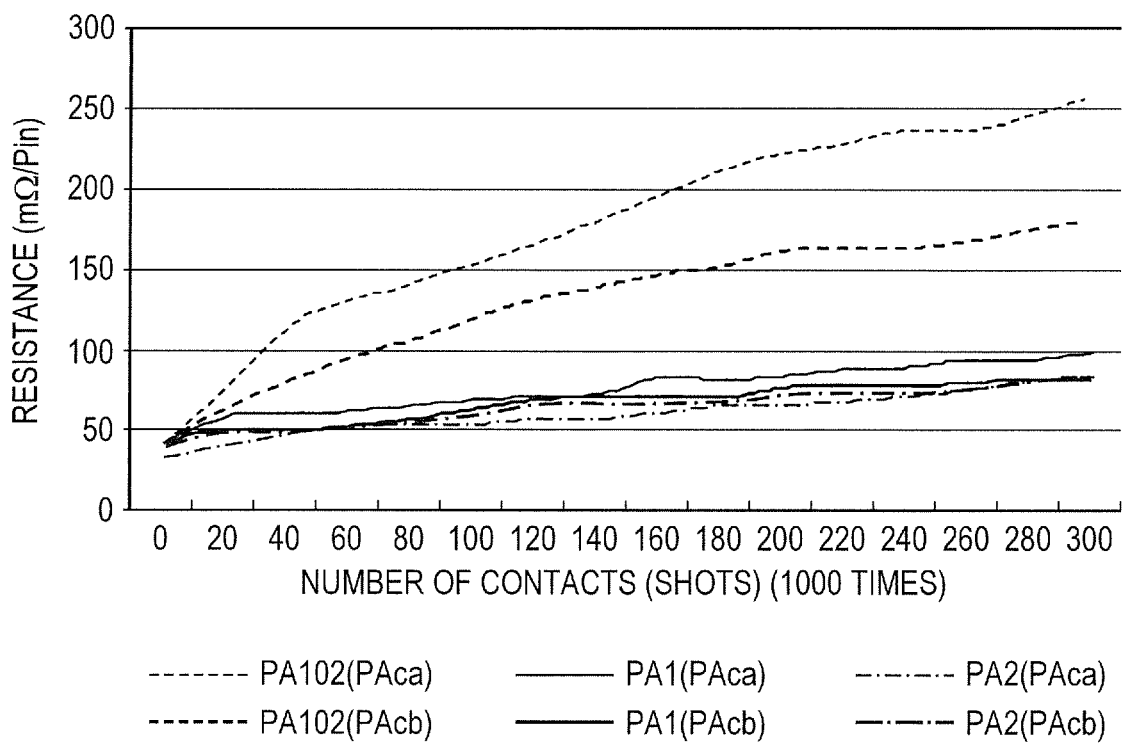
FIG. 18 shows extracted data of contact resistance when the number of contacts is 0 (without contact) and 300 thousand in the graph shown in FIG. 17.
FIG. 19 is a graph showing the relation between the number of contacts and contact resistance when the probe pins of Investigation Example 2, First Embodiment, and Second Embodiment are brought into contact at a contact load of 18 gf.
Figures 20, 21:
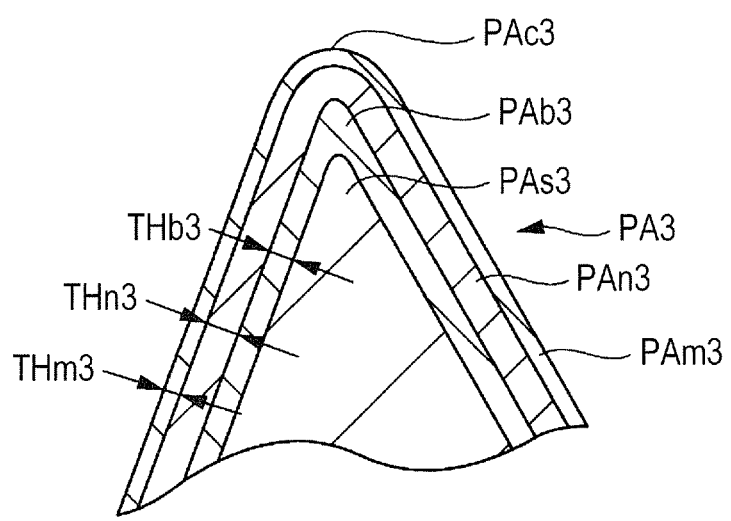
FIG. 20 shows extracted data of contact resistance when the number of contacts is 0 (without contact) and 300 thousand in the graph shown in FIG. 19.
FIG. 21 is an enlarged cross-sectional view of the tip portion of a probe pin of Third Embodiment.

Here, the relation between the contact number and the contact resistance of the probe pins PA1 and PA2 of the present embodiment with a solder ball will be described comparing the probe pin PA102 of Investigation Example 2. FIG. 17 is a graph showing the relation between the number of contacts and contact resistance when the probe pin PA102 of Investigation Example 2, the probe pin PA1 of First Embodiment, and the probe pin PA2 of Second Embodiment are brought into contact the solder ball SB of the semiconductor device SD1 at a contact load of 35 gf. FIG. 18 shows extracted data of contact resistance when the number of contacts is 0 (without contact) and 300 thousand in the graph shown in FIG. 17. FIG. 19 is a graph showing the relation between the number of contacts and contact resistance when the probe pin PA102 of Investigation Example 2, the probe pin PA1 of First Embodiment, and the probe pin PA2 of Second Embodiment are brought into contact with the solder ball SB of the semiconductor device SD1 at a contact load of 18 gf. FIG. 20 shows extracted data of contact resistance when the number of contacts is 0 (without contact) and 300 thousand in the graph shown in FIG. 19.

In FIGS. 17 to 20, in the probe pin PA102 of Investigation Example 2, the probe pin PA1 of First Embodiment, and the probe pin PA2 of Second Embodiment, tip portions having four protrusions are expressed as "protrusion PAca" and those having nine protrusions are expressed as "protrusion PAcb". This means that in FIGS. 17 and 18, the term "PA102 (PAca)" means resistance measured using the probe pin PA102 of Investigation Example 2 having four protrusions PAca at the tip portion PAc102. The "mΩ/Pin" used as a unit of resistance means that the resistance per probe pin is expressed as the unit of mΩ. The term "resistance" will hereinafter mean resistance per probe pin unless otherwise particularly specified.

As shown in FIG. 17, the resistance of the probe pin PA102 of Investigation Example 2 shows a linear functional increase until the number of contacts reaches 40000. Then, until the number of contacts reaches 300 thousand times, the resistance shows a mild increase. More specifically, when the resistance at 0 contact (without contact) and the resistance at 30 thousand contacts are compared, as shown in FIG. 18, the probe pin PA102 of Investigation Example 2 having four protrusions PAca has resistance of 24 mΩ at 0 contact (without contact) and has resistance of 136 mΩ at 300 thousand contacts, which is from about 4 to 5 times the resistance at 0 contact (without contact).

As shown in FIG. 17, on the other hand, the resistance of the probe pin PA1 of First Embodiment shows an increase almost at a constant ratio until the number of contacts reaches 30 thousand. An increase ratio of the resistance of the probe pin PA1 of First Embodiment is smaller than that of the resistance of the probe pin PA102 of Investigation Example 2. More specifically, when the resistance at 0 contact (without contact) and the resistance at 30 thousand contacts are compared, as shown in FIG. 18, the probe pin PA1 of First Embodiment having four protrusions PAca has resistance of 27 mΩ at 0 contact (without contact) while has resistance of 69 mΩ at 300 thousand contacts, which is about 2.5 times the resistance at 0 contact (without contact).

It has been found that compared with the probe pin PA102 of Investigation Example 2, the probe pin PA1 of First Embodiment can be prevented from having deteriorated electrical properties and have a lifetime (number of repeated use) about twice as long as that of the former one.

As investigated above, formation of a tin oxide film due to diffusion wear is thought to be a cause of an increase in the resistance of the probe pin PA102 of Investigation Example 2 because its tip portion PAc102 has the uppermost layer made of palladium. On the other hand, the probe pin PA1 of First Embodiment can have the above-described results because the conductive film PAm1 present as the upper most layer of the tip portion PAc1 is made of silver so that formation of a tin oxide film on the uppermost layer due to diffusion wear can be prevented.

As shown in FIG. 18, the probe pin PA1 of First Embodiment having four protrusions PAca has resistance of 69 mΩ at 30 thousand contacts, while the probe pin PA2 of Second Embodiment having four protrusions PAca has resistance of 58 mΩ at 30 thousand contacts. When the number of contacts is 30 thousand, the resistance of the probe pin PA2 of Second Embodiment is slightly smaller than that of the probe pin PA1 of First Embodiment. This is presumed as follows. As described above, in the probe pin PA2 of Second Embodiment, deterioration in electrical properties of the probe pin due to formation of a nickel oxide film on the uppermost layer by sliding wear can be prevented more effectively than in the probe pin PA1 of First Embodiment.

Here, resistance is compared by the number of protrusions provided at the tip portion of the probe pin. As shown in FIG. 18, in the probe pin PA102 of Investigation Example 2, the probe pin PA102 having nine protrusions PACB has resistance smaller than the probe pin PA102 having four protrusions PACa at 300 thousand contacts. This occurs because as described above, the larger the number of contact points between the tip portion of the probe pin and a solder film or solder ball, the smaller the contact resistance becomes.

On the other hand, in the probe pin PA1 of First Embodiment and the probe pin PA2 of Second Embodiment, there is almost no difference in resistance between the probe pin with four protrusions PAca and that with nine protrusions PAcb. This is presumed to occur because the sliding wear or diffusion wear of the conductive film formed at the tip portion of the probe pin hardly proceeds and sufficient conduction is achieved irrespective of the number of the protrusions.

Experimental results shown above are obtained by bringing the probe pin into contact at a contact load of 35 gf in repetition. FIGS. 19 and 20 show, on the other hand, experimental results obtained by bringing the probe pin into contact at a contact load of 18 gf in repetition. A decrease in the contact load suppresses smooth sticking of the tip portion of the probe pin in a solder ball (or solder film) and a contact area between the tip portion of the probe pin and the solder ball (or solder film) decreases. When the contact load is smaller, the state of the uppermost layer of the tip portion of the probe pin is presumed to have an influence on the experimental results.

As a result, as shown in FIG. 19, any of the probe pin PA102 of Investigation Example 2, the probe pin PA1 of First Embodiment, and the probe pin PA2 of Second Embodiment shows almost the same tendency as the results at a contact load of 35 gf shown in FIG. 17. As investigated above, since the uppermost layer of the tip portion PAc102 of the probe pin PA102 of Investigation Example 2 is made of a palladium alloy, formation of a tin oxide film on the uppermost layer by diffusion wear is presumed to be a cause of an increase in resistance. In the probe pin PA1 of First Embodiment, on the other hand, since the conductive film PAm1 present as the uppermost layer of the tip portion PAc1 is made of silver, suppression of formation of a tin oxide film on the uppermost layer by diffusion wear is presumed to have an influence on the above-described results.

Here, resistance is compared by the number of protrusions provided at the tip portion of the probe pin. As shown in FIG. 20, in the probe pin PA102 of Investigation Example 2 and the probe pin PA1 of First Embodiment, the probe pin having nine protrusions PAcb has resistance smaller than the probe pin having four protrusions PAca at 300 thousand contacts. This occurs because as described above, the larger the number of contact points between the tip portion of the probe pin and a solder film or solder ball, the smaller the contact resistance becomes.

In the probe pin PA2 of Second Embodiment, there is almost no difference in resistance between the probe pin with four protrusions PAca and that with nine protrusions PAcb. This is presumed to occur because the sliding wear or diffusion wear of the conductive film formed at the tip portion of the probe pin hardly proceeds and sufficient conduction is achieved irrespective of the number of the protrusions. This is presumed to occur because compared with the probe pin PA1 of First Embodiment, the probe pin PA2 of Second Embodiment can be prevented more effectively from having deteriorated electrical properties which will otherwise occur by the formation of a nickel oxide film on the uppermost layer by sliding wear.

Third Embodiment

FIG. 21 is an enlarged cross-sectional view of the tip portion of a probe pin of Third Embodiment. The probe pin PA of Third Embodiment will hereinafter be called "probe pin PA3".

As shown in FIG. 21, the tip portion PAc3 of the contact portion PAr of the probe pin PA3 of Third Embodiment is comprised of a base material PAs3, a nickel film PAb3 formed on the base material PAs3, a first conductive film PAn3 formed on the nickel film PAb3, and a second conductive film PAm3 formed on the first conductive film PAn3. The second conductive film PAm3 present as the uppermost layer is made of diamond-containing silver. The sum of the thickness THn3 of the first conductive film PAn3 and the thickness THm3 of the second conductive film PAm3 is greater than the thickness THb3 of the nickel film PAb3.

Materials configuring the base material PAs3 and the nickel film PAb3 of the probe pin PA3 of Third Embodiment are same as those configuring the base material PAs2 and the nickel film PAb2 of the probe pin PA2 of Second Embodiment, respectively.

The conductive film (silver film) of the tip portion PAc3 of the probe pin PA3 of Third Embodiment has a two layer structure comprised of the first conductive film PAn3 and the second conductive film PAm3 instead of the conductive film PAm2 of Second Embodiment. This is a difference between the probe pin PA3 of Third Embodiment and the probe pin PA2 of Second Embodiment.

In the probe pin PA2 of Second Embodiment, as described above, the conductive film PAm2 is made of diamond-containing silver in order to prevent exposure of the nickel film PAb2 due to sliding wear of the conductive film PAm2. Compared with diamond-free silver, diamond-containing silver may increase electric resistance because diamond is an insulator. In the probe pin PA3 of Third Embodiment, therefore, the entire conductive film (silver film) is not made of diamond-containing silver, but only the second conductive film PAm3 present as the uppermost layer is made of diamond-containing silver and the first conductive film PAn2 therebelow is made of diamond-free silver. The second conductive film PAm3 present as the uppermost layer can have enhanced wear resistance because it is made of diamond-containing silver. The bottom first conductive film PAn3 is made of diamond-free silver so that the electric resistance at the tip portion PAc3 of the probe pin PA3 can be reduced.

Thus, the probe pin PA3 of Third Embodiment is superior in wear resistance to the probe pin PA1 of First Embodiment because the second conductive film PAm3 present as uppermost layer is made of diamond-containing silver and in addition, can have electric resistance smaller than that of the probe pin PA2 of Second Embodiment because having, as the bottom layer, the first conductive film PAn3 made of diamond-free silver. Compared with the probe pin PA1 of First Embodiment and the probe pin PA2 of Second Embodiment, the probe pin of the present embodiment can be prevented more effectively from having deteriorated electrical properties and at the same time, have improved electrical properties.

Further, if the second conductive film PAm3 present as the uppermost layer wears or separates to expose the first conductive film PAn3 therebelow, also improvement in wear resistance of the first conductive film PAn3 is desired in order to prevent exposure of the nickel film PAb3 due to sliding wear of the first conductive film PAn3. In the probe pin PA3 of Third Embodiment, therefore, use of silver (hard silver) having a Vickers hardness of 100 HV or more as silver configuring the first conductive film PAn3 is preferred, with use of silver (hard silver) having 170 HV or more being more preferred from the standpoint of wear resistance. When the first conductive film PAn3 is made of silver (hard silver) having a Vickers hardness of 100 HV or more, preferably silver (hard silver) having 170 HV or more, the first conductive film PAn3 present below the second conductive film has improved wear resistance so that even when due to wear or separation of the second conductive film PAm3 present as the uppermost layer, the first conductive film PAn3 therebelow is exposed, exposure of the nickel film PAb3 due to sliding wear of the first conductive film PAn3 can be prevented.

Third Embodiment is similar to the above-described First Embodiment and Second Embodiment except for the configuration and the configuring material of the conductive film (silver film) of the probe pin PA3, so that it has advantages similar to those of the probe pin PA1 of First Embodiment and the probe pin PA2 of Second Embodiment described above.

Here, the thickness THn3 of the first conductive film PAn3, the thickness THm3 of the second conductive film PAm3, and the thickness THb3 of the nickel film PAb3 in Third Embodiment will be described. It is desired that the probe pin PA3 of Third Embodiment, similar to the probe pin PA1 of First Embodiment or the probe pin PA2 of Second Embodiment, has a thick conductive film (silver film) to prevent exposure of the nickel film PAb3 even if sliding wear occurs and has a thin nickel film PAb3 to prevent the nickel film PAb3 from cracking due to film stress. In the probe pin PA3 of Third Embodiment, therefore, the sum of the thickness THn3 of the first conductive film PAn3 and the thickness THm3 of the second conductive film PAn3 is made greater than the thickness THb3 of the nickel film PAb3.

The nickel film PAb3 of Third Embodiment has, similar to First Embodiment and Second Embodiment, a thickness THb3 of preferably 1.0 μm or more to surely prevent diffusion of copper. The nickel film PAb3 has, on the other hand, a thickness THb3 of preferably 2.0 μm or less to prevent cracking of the nickel film PAb3 due to film stress.

To reduce the electric resistance of the tip portion PAc3 of the probe pin PA3, it is preferred to thin the second conductive film PAm3 made of diamond-containing silver and thicken the first conductive film PAn3 made of diamond-free silver. The second conductive film PAm3 is preferably made thinner than the first conductive film PAn3. The second conductive film PAm3 present as the uppermost layer has a thickness THm3 of preferably 1.0 µm or more to display its wear resistance attributable to the diamond-containing silver.

The sum of the thickness THn3 of the first conductive film PAn3 and the thickness THm3 of the second conductive film PAm3 is preferably greater to prevent exposure of the nickel film PAb3 even if sliding wear of the first conductive film PAn3 and the second conductive film PAm3 occurs. Thickening the first conductive film PAn3 and the second conductive film PAm3 too much may round the tip portion PAc3 of the probe pin PA3 and this may cause an increase in contact resistance with a device to be tested. To keep sharpness of the tip portion PAc3 of the probe pin PA3, the sum of the thickness THn3 of the first conductive film PAn3, the thickness THm3 of the second conductive film PAm3, and the thickness THb3 of the nickel film PAb3 is preferably 8.0 µm or less.

It is therefore most suited that the thickness THn3 of the first conductive film PAn3 is from 2.0 µm to 4.0 µm, the thickness THm3 of the second conductive film PAm3 is from 1.0 µm to 2.0 µm, and the thickness THb3 of the nickel film PAb3 is 1.5 µm.

MODIFICATION EXAMPLE

The invention made by the present inventors has been described specifically based on some embodiments. It is needless to say that the invention is not limited by these embodiments, but can be changed in various ways without departing from the gist of the invention.

Modification Example 1

In the above embodiments, a semiconductor device SD1 having an area-array type such as BGA type is described as an example of a semiconductor device to be tested, but the package mode of the semiconductor device to be tested is not limited to it. As Modification Example 1, an application example to a semiconductor device SD2 having a QFP type which is a leadframe type as shown in FIGS. 22 and 23 will next be described.

Figure 22:
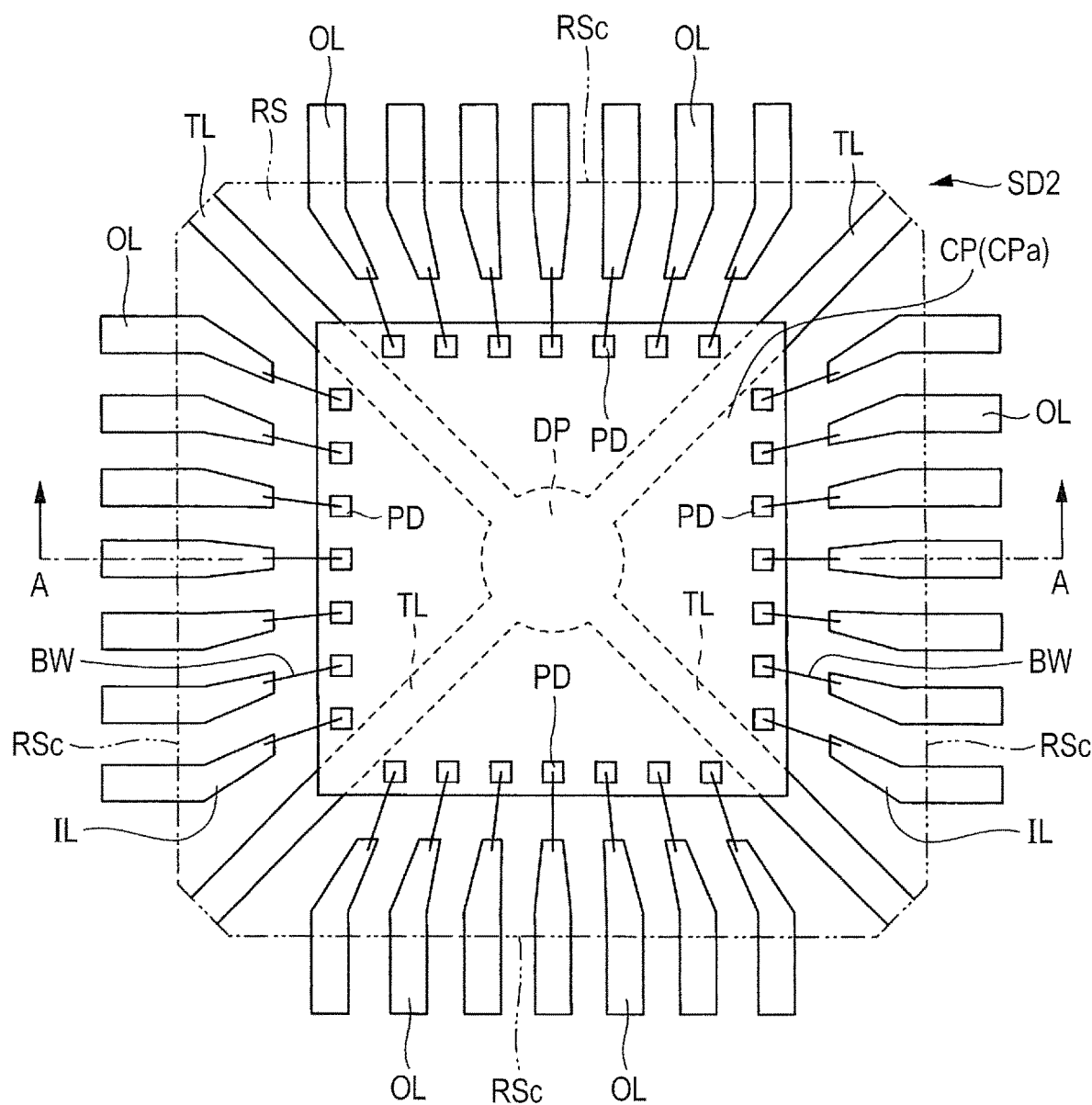
FIG. 22 is a see-through plan view showing the outline of the internal structure of a semiconductor device of Modification Example 1.

FIG. 22 is a see-through plan view showing the outline of the internal structure of the semiconductor device SD2 of Modification Example 1. FIG. 23 is a cross-sectional view taken along the line A-A of FIG. 22. FIG. 22 shows a planar arrangement inside the semiconductor device SD2 by plotting the outer edge profile of the sealing body RS with a two-dot chain line to show the sealing body RS in see-through state.

Figure 23:
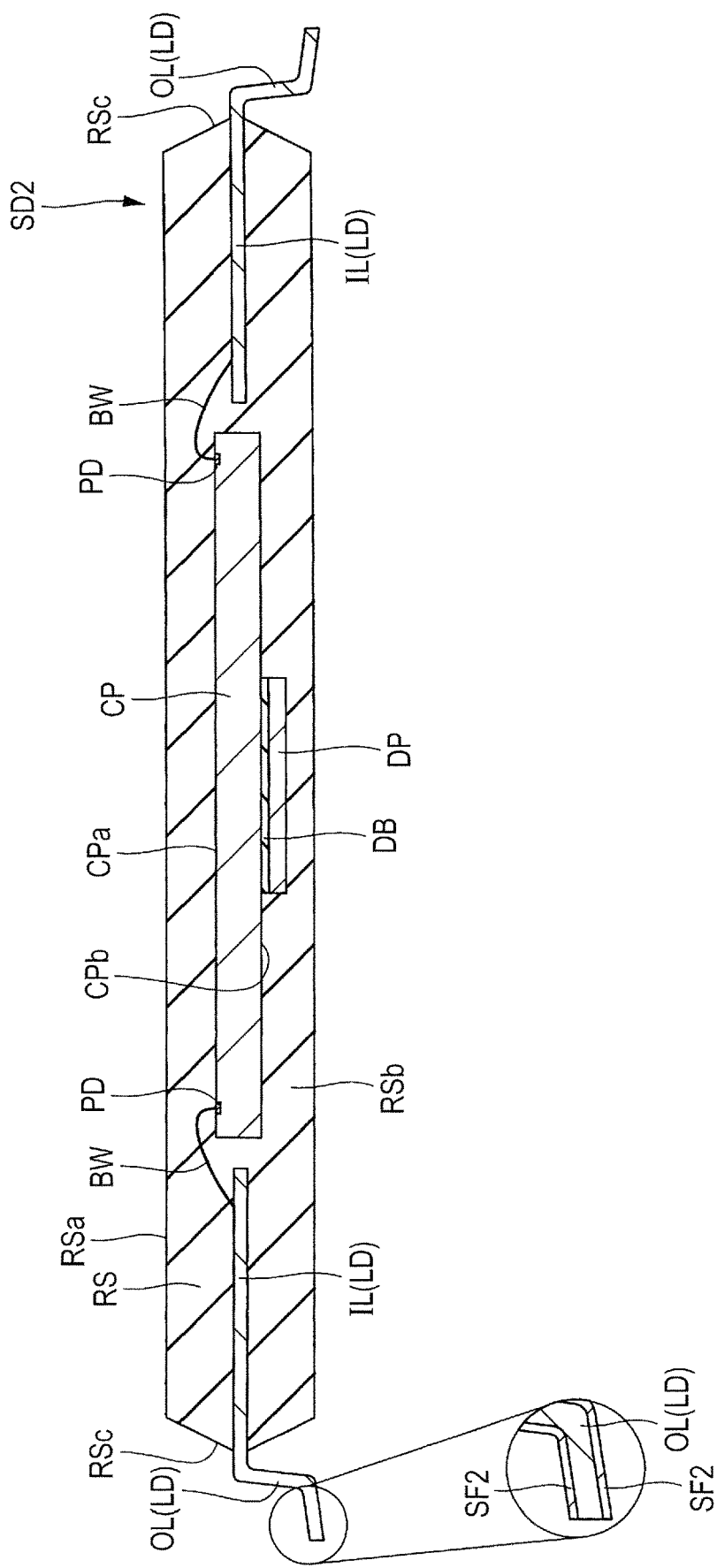
FIG. 23 is a cross-sectional view taken along the line A-A of FIG. 22.

The semiconductor device SD2 of Modification Example 1 shown in FIGS. 22 and 23 is a semiconductor package obtained by embedding a semiconductor chip CP in the sealing body (sealing resin) RS. As shown in FIGS. 22 and 23, the semiconductor device SD2 has the semiconductor chip CP, a plurality of wires (conductive members) BW, a plurality of leads (external terminals) LD, and the sealing body RS.

The sealing body RS has a substantially rectangular planar shape having four sides and at each of the sides, the plurality of leads LD protrudes from the sealing body RS so as to extend in a direction orthogonal to the side. The sealing body RS has at the center portion thereof the semiconductor chip CP.

The semiconductor chip CP has a surface (main surface) CPa, a back surface (main surface) CPb positioned on the side opposite to the surface CPa, and a plurality of pad electrodes (chip electrodes, terminals) PD formed on the surface CPa. Although not illustrated, the semiconductor chip CP has, on the side of the surface CPa thereof, a plurality of semiconductor elements such as transistor or diode and these semiconductor elements are electrically coupled to the plurality of pad electrodes PD formed on the surface CPa.

As shown in FIG. 22, the semiconductor chip CP is mounted (fixed) onto a die pad (chip mounting portion) DP supported by a plurality of suspending leads TL via an adhesive DB (refer to FIG. 23). The plurality of pad electrodes PD of the semiconductor chip CP is electrically coupled to the plurality of leads LD, which are external terminals, via the wire BW, respectively. The leads LD are made of, for example, copper. The wire BW is made of, for example, gold or copper.

The semiconductor chip CP and the plurality of wires BW are resin-sealed by the sealing body RS. The sealing body RS has, as shown in FIG. 23, an upper surface (surface) RSa, a lower surface (surface) RSb positioned on the side opposite to the upper surface RSa, and a side surface RSc positioned between the upper surface RSa and the lower surface RSb. The sealing body RS is an insulated body obtained, for example, by adding a filler such as silica to a thermosetting resin.

A portion of each of the plurality of the leads LD is sealed inside the sealing body RS and the other portion is exposed. These portions are distinguished by calling a portion inside the sealing body RS "inner lead portion IL" and a portion outside the sealing body RS "outer lead portion OL". This outer lead portion OL serves as an external terminal of the semiconductor device SD2. As shown in FIG. 23, the outer lead portion OL has a gullwing shape. The outer lead portion OL has, on the surface thereof, a solder film SF2.

This solder film SF2 is called "external plating film". The solder film SF2 formed on the surface of the outer lead portion (external terminal) OL in advance can improve wetness of the external terminal to solder which is a conductive bonding material, when the semiconductor device SD2 is mounted on a mounting substrate. The solder film SF2 is made of the above-described lead-free solder, for example, a solder composed only of tin (Sn), tin-bismuth (Sn—Bi), tin-copper (Sn—Cu), or tin-copper-silver (Sn—Cu—Ag).

The structure of the semiconductor package can be applied to a QFN type semiconductor device (not shown) as a modification example, not limited to the example shown in FIGS. 22 and 23. The above-described QFP type semiconductor device SD2 has a structure in which the outer lead portion OL protrudes from the side surface RSc of the sealing body RS, while the QFN type semiconductor device has a structure in which the outer lead portion (external terminal) is exposed from the sealing body at the bottom surface (mounting surface) of the sealing body. Even in this QFN type semiconductor device, it is preferred to form a metal film (solder plating film) made of a solder on the exposed surface in advance from the standpoint of improving wetness of the external terminal to the solder serving as a conductive bonding material when the device is mounted on a mounting substrate.

(Method of Manufacturing Semiconductor Device of Modification Example 1)

Figure 24:
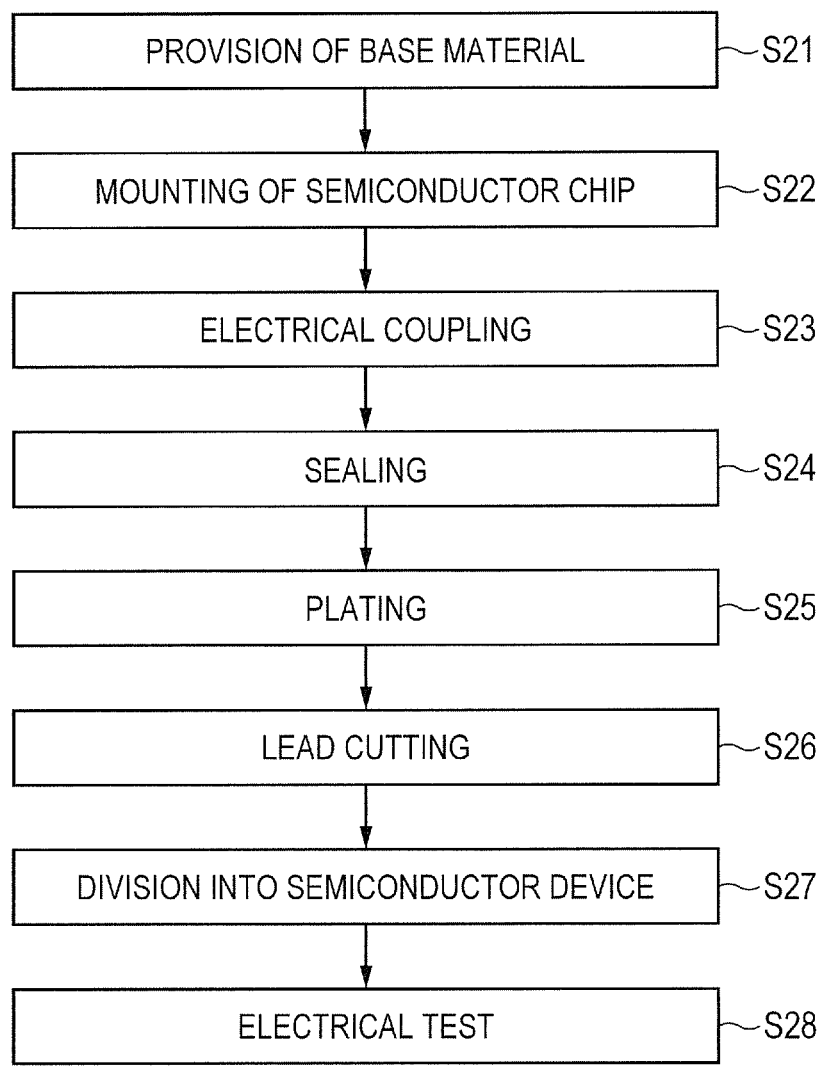
FIG. 24 is a process flow chart showing the manufacturing steps of the semiconductor device shown in FIGS. 22 and 23.

Next, manufacturing steps of the semiconductor device SD2 shown in FIGS. 22 and 23 will be described. FIG. 24 is a chart showing a fabrication flow of the semiconductor device shown in FIGS. 22 and 23. The semiconductor device SD2 of Modification Example 1 is manufactured based on the fabrication flow shown in FIG. 24.

1. Base Material Providing Step (S21)

In the base material providing step (S21) shown in FIG. 24, a leadframe, which is not shown, is provided as a base material on which a semiconductor chip CP is mounted. This leadframe has, in a product formation region thereof, a plurality of suspending leads TL having a die pad DP on which the semiconductor chip CP is mounted and a plurality of leads LD. Although not shown, the product formation region corresponds to one of the semiconductor devices SD2 shown in FIG. 22 and this product formation region has, therearound, a cut region along which the leadframe is cut in the division step (S27) shown in FIG. 24.

The material configuring the leadframe is not limited to the following ones, but it is made of, for example, copper (Cu), a copper alloy, or a nickel plating film stacked on the surface of copper. Alternatively, it is formed by subjecting a metal plate made of an iron-based material such as 42 alloy to patterning treatment.

2. Semiconductor Chip Mounting Step (S22)

Next, in the semiconductor chip mounting step (die bonding step) (S22) shown in FIG. 24, the semiconductor chip CP is mounted on the die pad DP shown in FIG. 22 via an adhesive DB (refer to FIG. 23). As the adhesive DB, for example, a thermosetting resin or a mixture of the thermosetting resin with silver (Ag) particles is used. The semiconductor chip is mounted, for example, by a so-called face-up mounting system in which the semiconductor chip CP is mounted while facing a back surface CPb (refer to FIG. 23) of the semiconductor chip CP to the upper surface of the die pad DP.

3. Electrical Coupling Step (S23)

In the electrical coupling step (S23) shown in FIG. 24, a plurality of pad electrodes PD of the semiconductor chip CP and a plurality of leads LD placed around the semiconductor chip CP are electrically coupled respectively via a plurality of wires BW as shown in FIG. 22. In Modification Example 1, the wire WB is coupled, for example, by a ball bonding (nail head bonding) method using ultrasonic vibration and thermocompression in combination for bonding of the wire BW. Examples of the material of the wire BW include gold and copper, and alloys thereof.

4. Sealing Step (S24)

Next, in the sealing step (S24) shown in FIG. 24, the semiconductor chip CP, the die pad DP, the plurality of wires BW, and a portion of the plurality of leads LD (corresponding to the inner lead portion IL) are sealed with a sealing body RS. In Modification Example 1, the sealing body RS is formed, for example, by so-called transfer molding system in which a resin is pressed into a mold, followed by curing.

5. Plating Step (S25)

Next, in the plating step (S25) shown in FIG. 24, a metal film (plating film) made of a solder is formed on the surface of the lead LD shown in FIG. 22. In Modification Example 1, for example, the lead LD is immersed in a plating solution to form a metal film (solder plating film) SF2 shown in FIG. 23 on the surface of the lead LD (corresponding to the outer lead portion OL) exposed from the sealing body RS.

The solder film SF2 is formed from the standpoint of improving the wetness of the external terminal to the solder serving as a conductive bonding material at the time of mounting on the mounting substrate as described above. The solder film SF2 is not required to be thick insofar as the surface of the base material portion (base portion) made of a metal configuring the lead LD is covered with the solder film SF2. In Modification Example 1, the solder film SF2 is thinner than the outer lead portion OL and has a thickness of, for example, from about 10 μm to 20 μm.

6. Lead Cutting Step (Lead Forming Step) (S26)

Next, in the lead cutting step (S26) shown in FIG. 24, the lead frame, which is a base material on which the semiconductor chip CP is mounted, is cut at the end portion of the outer lead portion OL, though not illustrated. Although the cutting method of this step is not particularly limited, it is cut, for example, by press working, while arranging a punch (cutting blade) on the lower surface side of the leadframe and a die (support jig) on the upper surface side.

As shown in FIG. 23, the outer lead portion OL of the lead LD of Modification Example 1 is formed to have a gullwing shape. Although a method of forming the outer lead portion of the lead LD is not particularly limited, it can be formed by press working with a punch and a die therefor. Thus, the lead cut step (S26) is performed.

7. Division Step (S27)

Next, in the division step shown in FIG. 24, the suspending lead TL shown in FIG. 22 is cut to obtain individual semiconductor devices SD2 having the semiconductor chip CP thereon. As a dividing method, for example, a method of cutting by press working with a cutting mold can be used.

The semiconductor device SD2 obtained by the present step is a still half-completed one (assembly) before test. After the present step, therefore, the semiconductor device SD2 accepted as a result of an appearance inspection step and the electrical test step shown in FIG. 24 is regarded as a completed one shown in FIGS. 22 and 23.

8. Electrical Test Step (S28)

Next, in the electrical test step shown in FIG. 24, a test is performed to confirm whether the circuit has disconnection or the device has predetermined (within an acceptable range) electrical properties when a current is supplied to the semiconductor device. In addition, in the present step, based on the results of the electrical test, the device is classified as non-defective or defective and the defective one is removed.

The electrical test step will hereinafter be described in detail.

(Electrical Test Step in Modification Example 1)

Figure 25:
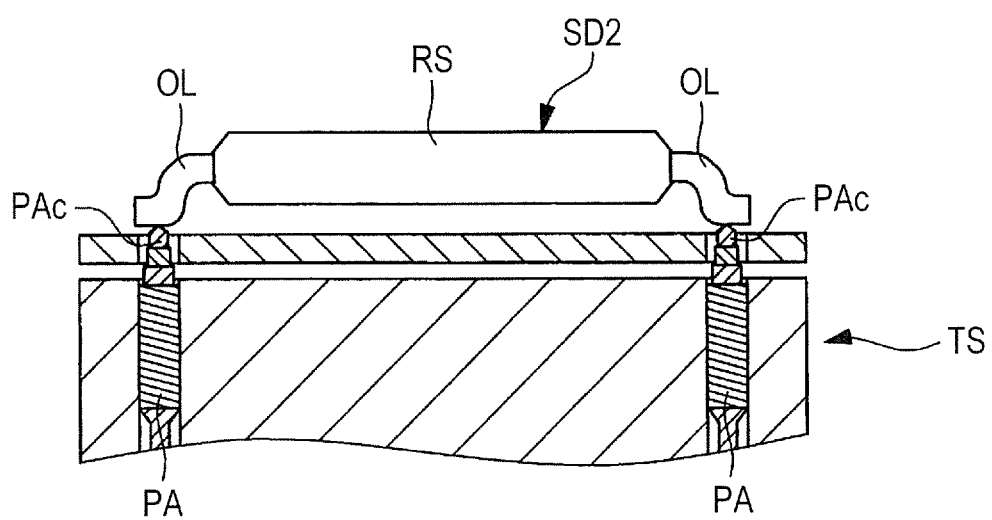
FIG. 25 is a partially enlarged fragmentary cross-sectional view of a socket of a test device having the semiconductor device of Modification Example 1 housed therein.

FIG. 25 is a partially enlarged fragmentary cross-sectional view of a socket of a test device in which the semiconductor device of Modification Example 1 is housed.

As shown in FIG. 25, in Modification Example 1, after the semiconductor device SD2 is placed on the socket TS, the tip portion of the outer lead portion OL protruding outward from the sealing body RS is pressed against the probe pin PA. By this, the tip portion PAc of the probe pin PA is brought into contact with the outer lead portion OL. In particular, as shown in FIG. 23, since in the semiconductor device SD2 of Modification Example 1, the outer lead portion OL has, on the surface thereof, the solder film SF, the tip portion PAc of the probe pin PA is brought into contact with the solder film SF2.

To reduce the contact resistance between the probe pin PA and the outer lead portion OL and perform an electrical test stably, it is preferred in the present embodiment to set a contact load between the probe pin PA and the outer lead portion OL, for example, at from about 20 gf (about 0.2 N) to 50 gf (about 0.5 N) and cause the tip portion PAc of the probe pin PA to stick in the solder film SF2 or outer lead portion OL. The term "contact load" as used herein means a load which the outer lead portion OL receives from the probe pin PA at the time of contact.

The electrical test is performed by sending a predetermined electric signal from an outside test circuit (not shown) to the semiconductor device SD2. During the test, the power is supplied to the semiconductor device SD2 via the probe pin PA and a signal current sent from the semiconductor device SD2 is measured to confirm that the circuit has no disconnection or the device has predetermined electrical properties (within an acceptable range). Based on the results of the electrical test, products are determined whether they are defective or non-defective and defective products are removed. They are sorted, for example, by conveying defective products and non-defective products to respectively different destinations when they are taken out from the socket TS.

The tip portion PAc of the probe pin PA of Modification Example 1 can employ a configuration similar to that of the tip portion PAc1 of the probe pin PA1 of First Embodiment. Described specifically, the tip portion PAc of the probe pin PA of Modification Example 1 has a base material, a nickel film formed on the base material, and a conductive film formed on the nickel film and made of silver (Refer to FIG. 10). The conductive film is thicker than the nickel film. The probe pin PA of Modification Example can therefore be prevented from having deteriorated electrical properties as a probe pin because diffusion wear and sliding wear of the conductive film formed as the uppermost layer of the tip portion PAc can be reduced.

The tip portion PAc of the probe pin PA of Modification Example 1 using a configuration similar to that of the probe pin PA1 of First Embodiment is described above, but the configuration is not limited to it. It may have a configuration similar to that of the probe pin PA2 of Second Embodiment or the probe pin PA3 of Third Embodiment.

Modification Example 2

Figure 26:
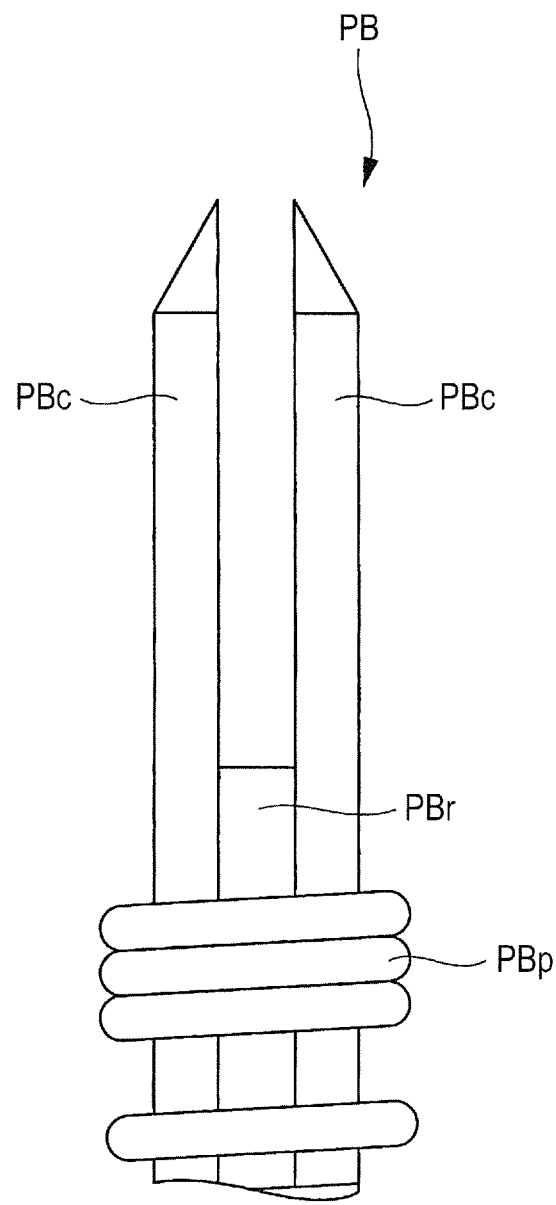
FIG. 26 is a fragmentary cross-sectional view showing the structure of a probe pin which a socket of a test device of Modification Example 2 has.

FIG. 26 is a fragmentary cross-sectional view showing the structure of a probe pin which a socket of a test device of Modification Example 2 has. The probe pin PA of Modification Example 2 will hereinafter be called "probe pin PB".

As shown in FIG. 26, the probe pin PB of Modification Example 2 is housed slidably in a main body portion (not shown) and is comprised of two contact portions PBc and PBc to be brought into contact with an external terminal of a test board, a slender rectangular parallelepiped support portion PBr sandwiched between the contact portions PBc and PBc, and a spring member PBp that applies pressure to the contact portions PBc and PBc in a direction of pushing them out from the main body portion (not shown). The contact portions PBc and PBc are contact regions of the probe pin PB and have a substantially trigonal pyramid-shaped tip portion.

When a test is performed, a load is always applied to the contact portions PBc and PBc in a direction of pushing them out from the main body portion (not shown) by means of the spring member RPb to surely bring the tip portion of the contact portions PBc and PBc into contact with the external terminal of the semiconductor device.

The contact portions PBc and PBC of the probe pin PB of Modification Example 2 can employ a configuration similar to that of the tip portion PAc1 of the probe pin PA1 of First Embodiment. Described specifically, the contact portions PBc and PBc of the probe pin PB of Modification Example 2 have a base material, a nickel film formed on the base material, and a conductive film formed on the nickel film and made of silver (refer to FIG. 10). The conductive film is thicker than the nickel film. The probe pin PB of Modification Example 2 can therefore be prevented from having deteriorated electrical properties as a probe pin, because diffusion wear and sliding wear of the conductive film formed as the uppermost layer of the contact portions PBc and PBc can be reduced simultaneously.

The contact portions PBc and PBc of the probe pin PB of Modification Example 2 are described above with those using a configuration similar to that of the probe pin PA1 of First Embodiment as an example. The configuration is not limited to it, but they may have a configuration similar to that of the probe pin PA2 of Second Embodiment or the probe pin PA3 of Third Embodiment.

Modification Example 3

Figure 27:
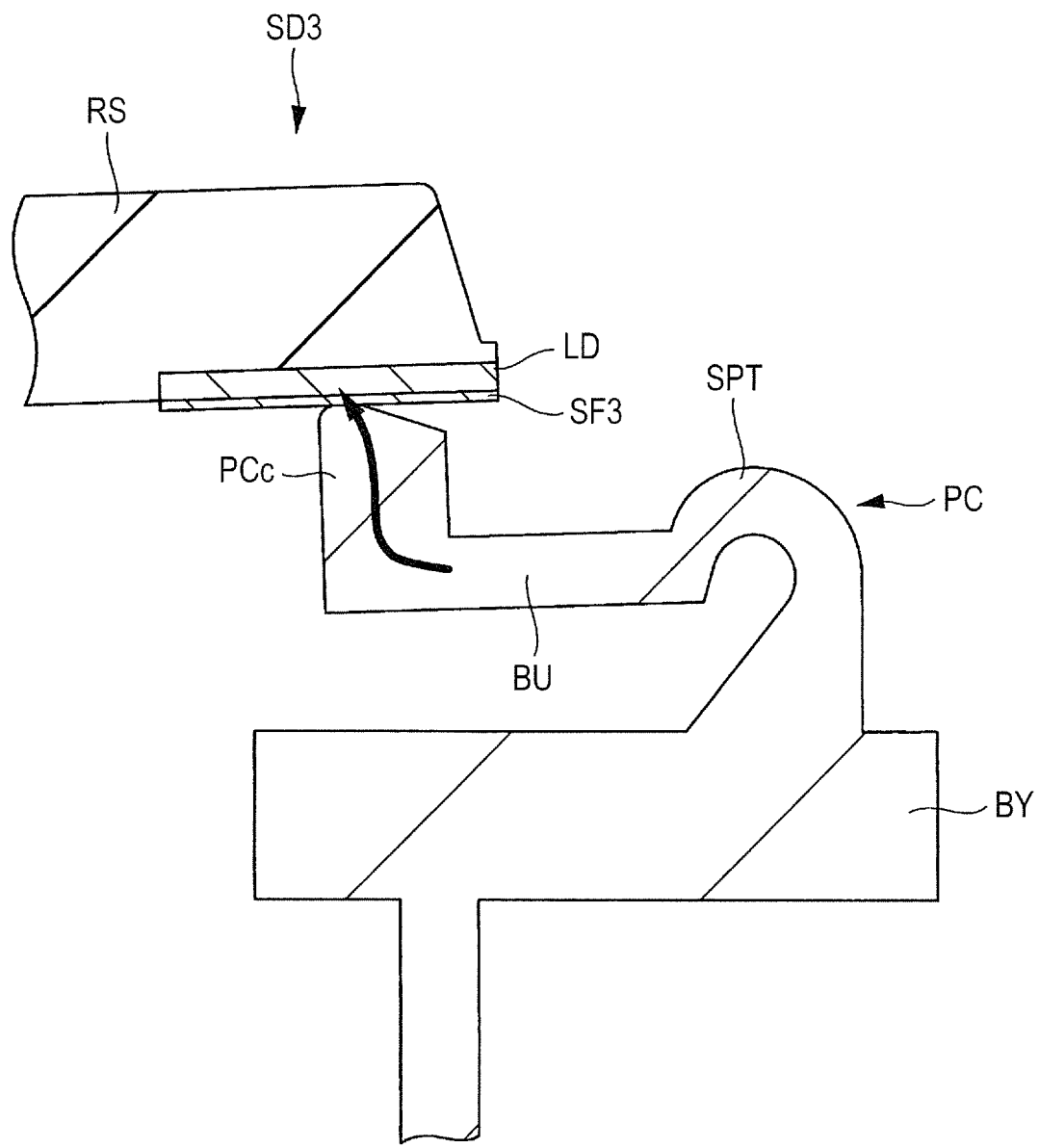
FIG. 27 is a cross-sectional view showing the configuration of a terminal which a socket of a test device of Modification Example 3 has and its mode.

FIG. 27 is a cross-sectional view showing the configuration of a socket terminal PC of a test device of Modification Example 3 and its mode.

In First Embodiment, Second Embodiment, Third Embodiment, Modification Example 1, and Modification Example 2, probe pins PA, PA1, PA2, PA3, and PB whose rod-like terminal having a sharp tip portion changes its position in a perpendicular direction are described as an example of a test terminal used in an electrical test. On the other hand, there is a socket terminal having a so-called flat spring structure which secures contact between an external terminal and a tip portion by the bending of a plate-like member when the external terminal of a semiconductor device is pressed against the tip portion. More specifically, as shown in FIG. 27, a socket terminal (test terminal) PC having a flat spring structure is equipped with a main body portion BY having a support portion SPT and a plate-like member BU coupled to the support portion SPT and including a tip portion PCc protruding to the arrangement side of a semiconductor device SD3. The plate-like member BU is bent when a lead (external terminal) LD of the semiconductor device SD3 is pressed against the tip portion PCc. Such a socket terminal PC is used in an electrical test of a QFP or QFN type semiconductor device.

The tip portion PCc of the socket terminal PC of Modification Example 3 is a contact region of the socket terminal PC and it may have a configuration similar to that of the tip portion PAc1 of the probe pin PA1 of First Embodiment. Described specifically, the tip portion PCc of the socket terminal PC of Modification Example 3 has a base material, a nickel film formed on the base material, and a conductive film formed on the nickel film and made of silver (Refer to FIG. 10). The conductive film is thicker than the nickel film. The socket terminal PC of Modification Example 3 can reduce both diffusion wear and sliding wear so that it can be prevented from having deteriorated electrical properties.

When a large current must be supplied to a socket terminal in an electrical test, a socket terminal having a flat spring structure is effective because it can easily secure a contact area with a lead and at the same time, can achieve space saving. For example, when a current is supplied to the socket terminal PC shown in FIG. 27, it flows between the lead LD of the semiconductor device SD3 and the tip portion PCc of the socket terminal PC, and a temperature of the contact position between the solder film SF3 that covers the lead LD and the tip portion PCc of the socket terminal PC becomes high. The socket terminal is therefore preferably that usable under high temperature conditions when it is used in an electrical test requiring application of a large current.

Under such a demand, the tip portion PCc of the socket terminal PC of Modification Example 3 has, on the uppermost layer, a conductive film made of silver so that formation of a nickel oxide film or a tin oxide film at the tip portion PCc can be prevented effectively. The socket terminal PC of Modification Example 3 can therefore have less deteriorated electrical properties even when a large current is applied in an electrical test.

The tip portion PCc of the socket terminal PC of Modification Example 3 is described above with that having a configuration similar to that of the probe pin PA1 of First Embodiment as an example, but the configuration is not limited to it. It may have a configuration similar to that of the probe pin PA2 of Second embodiment or the probe pin PA3 of Third Embodiment.

What is claimed is:

1. A method of manufacturing a semiconductor device, comprising the steps of:
    (a) providing a semiconductor device having a semiconductor chip and an external terminal electrically coupled to a semiconductor integrated circuit formed over a main surface of the semiconductor chip; and
    (b) bringing the external terminal into contact with a contact region of a test terminal to test electrical properties of the semiconductor integrated circuit,
    wherein the contact region of the test terminal has a base material, a nickel film formed over the base material, and a conductive film formed over the nickel film and including silver, and
    wherein the conductive film is thicker than the nickel film.

2. The method of manufacturing a semiconductor device according to claim 1,
    wherein the conductive film includes silver having a Vickers hardness of 170 HV or more.

3. The method of manufacturing a semiconductor device according to claim 1,
    wherein the conductive film includes silver containing diamond nanoparticles.

4. The method of manufacturing a semiconductor device according to claim 3,
    wherein primary particles of the nanoparticles have a particle size of 5 nm or less.

5. The method of manufacturing a semiconductor device according to claim 1,
    wherein the conductive film has a first conductive film formed over the nickel film and a second conductive film formed over the first conductive film, and
    wherein the second conductive film includes silver containing diamond nanoparticles.

6. The method of manufacturing a semiconductor device according to claim 5,
    wherein the first conductive film includes silver having a Vickers hardness of 170 HV or more.

7. The method of manufacturing a semiconductor device according to claim 5,
    wherein primary particles of the nanoparticles have a particle size of 5 nm or less.

8. The method of manufacturing a semiconductor device according to claim 5,
    wherein the second conductive film is thinner than the first conductive film.

9. The method of manufacturing a semiconductor device according to claim 1,
    wherein the base material includes a material containing copper.

10. The method of manufacturing a semiconductor device according to claim 1,
    wherein the base material includes beryllium copper.

11. The method of manufacturing a semiconductor device according to claim 1,
    wherein the base material includes a carbon steel material.

12. The method of manufacturing a semiconductor device according to claim 1,
    wherein the external terminal is a solder ball.

13. The method of manufacturing a semiconductor device according to claim 1,
    wherein the external terminal is covered with a solder film.

14. The method of manufacturing a semiconductor device according to claim 1,
    wherein the test terminal is a probe pin.

15. The method of manufacturing a semiconductor device according to claim 1,
    wherein the test terminal is a socket terminal having a flat spring structure.

* * * * *